(12) United States Patent
Wunsch et al.

(10) Patent No.: US 10,685,906 B2
(45) Date of Patent: Jun. 16, 2020

(54) ELECTRICALLY CONDUCTIVE DETERMINISTIC LATERAL DISPLACEMENT ARRAY IN A SEMICONDUCTOR DEVICE

(71) Applicant: International Business Machines Corporation, Armonk, NY (US)

(72) Inventors: Benjamin Wunsch, Mt. Kisco, NY (US); Joshua T. Smith, Croton on Hudson, NY (US); Stacey Gifford, Fairfield, CT (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/189,787

(22) Filed: Nov. 13, 2018

(65) Prior Publication Data
US 2020/0152550 A1 May 14, 2020

(51) Int. Cl.
| | | |
|---|---|---|
| H01L 23/48 | (2006.01) | |
| H01L 21/02 | (2006.01) | |
| H01L 21/56 | (2006.01) | |
| H01L 21/306 | (2006.01) | |
| H01L 23/29 | (2006.01) | |
| H01L 21/3213 | (2006.01) | |
| H01L 21/48 | (2006.01) | |
| H01L 21/033 | (2006.01) | |

(52) U.S. Cl.
CPC ........ *H01L 23/481* (2013.01); *H01L 21/0259* (2013.01); *H01L 21/0337* (2013.01); *H01L 21/30604* (2013.01); *H01L 21/3213* (2013.01); *H01L 21/486* (2013.01); *H01L 21/56* (2013.01); *H01L 23/291* (2013.01)

(58) Field of Classification Search
None
See application file for complete search history.

(56) References Cited

U.S. PATENT DOCUMENTS

| | | |
|---|---|---|
| 6,086,825 A | 7/2000 | Sundberg et al. |
| 7,014,747 B2 | 3/2006 | Cummings et al. |
| 7,666,687 B2 | 2/2010 | Webster et al. |
| 7,988,840 B2 | 8/2011 | Huang et al. |
| 8,518,328 B2 | 8/2013 | Padmanabhan et al. |
| 9,478,685 B2 | 10/2016 | Yu et al. |
| 9,636,675 B2 | 5/2017 | Astier et al. |

(Continued)

OTHER PUBLICATIONS

Huang et al., Continuous Particle Separation Through Deterministic Lateral Displacement, Science Mag, May 14, 2004, pp. 987-990, vol. 304.

(Continued)

*Primary Examiner* — Herve-Louis Y Assouman
(74) *Attorney, Agent, or Firm* — Amin, Turocy & Watson, LLP

(57) ABSTRACT

Devices and methods that can facilitate electrically conductive deterministic lateral displacement (DLD) pillar array components are provided. According to an embodiment, a device can comprise a substrate that can have a channel that can comprise electrically conductive pillar components that can be coupled to one or more electrodes. The device can further comprise a seal layer that can be coupled to the substrate that seals the one or more electrodes.

13 Claims, 17 Drawing Sheets

(56) References Cited

U.S. PATENT DOCUMENTS

| | | | |
|---|---|---|---|
| 9,833,782 B2 | 12/2017 | Smith et al. | |
| 9,901,926 B2 | 2/2018 | Azpiroz et al. | |
| 2001/0045357 A1* | 11/2001 | Broadley | G01N 27/401 |
| | | | 204/435 |
| 2004/0147014 A1 | 7/2004 | Ikuta | |
| 2006/0122048 A1 | 6/2006 | Hlavinka et al. | |
| 2014/0339090 A1* | 11/2014 | Huang | B01L 3/50273 |
| | | | 204/603 |
| 2015/0159195 A1 | 6/2015 | Leclipteux et al. | |
| 2016/0122686 A1 | 5/2016 | Dietz | |
| 2016/0144406 A1* | 5/2016 | Astier | B07B 13/04 |
| | | | 209/675 |
| 2017/0266593 A1 | 9/2017 | Smith et al. | |
| 2017/0312747 A1 | 11/2017 | Hu et al. | |
| 2017/0343509 A1 | 11/2017 | Austin et al. | |

OTHER PUBLICATIONS

Inglis et al., Critical particle size for fractionation by deterministic lateral displacement., Lab on a Chip, Mar. 17, 2006, pp. 655-658, vol. 6.

Zeming et al., Real-time modulated nanoparticle separation with an ultra-large dynamic range, Lab on a Chip, Jan. 7, 2016, pp. 75-85, vol. 16.

Song et al., Continuous-Flow Sorting of Stem Cells and Differentiation Products based on Dielectrophoresis, Lab on a Chip, Mar. 7, 2015, 14 Pages, vol. 5.

"Single Layer Nanofluidic Separator Chip and Fluidic Processor" U.S. Appl. No. 15/815,846, filed Nov. 17, 2018. 29 pages.

* cited by examiner

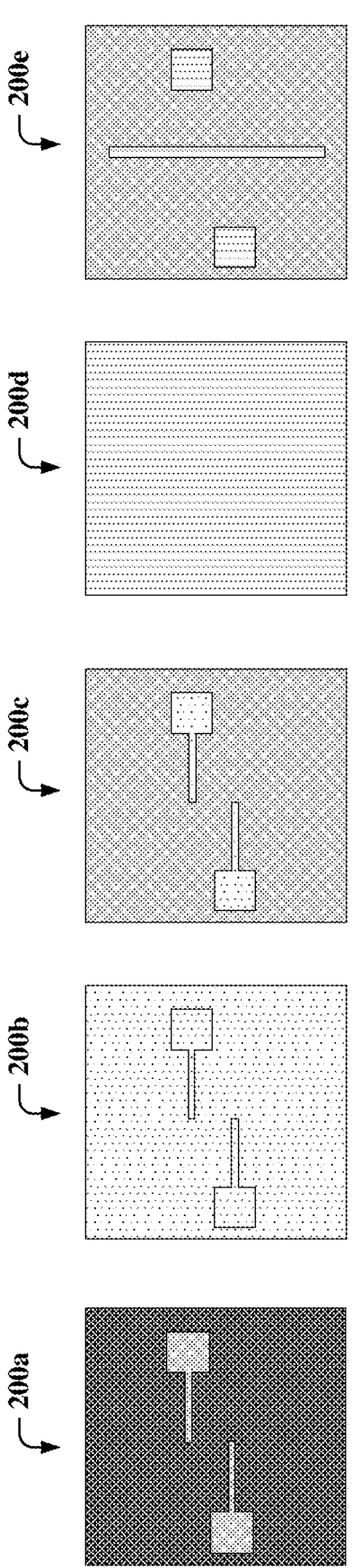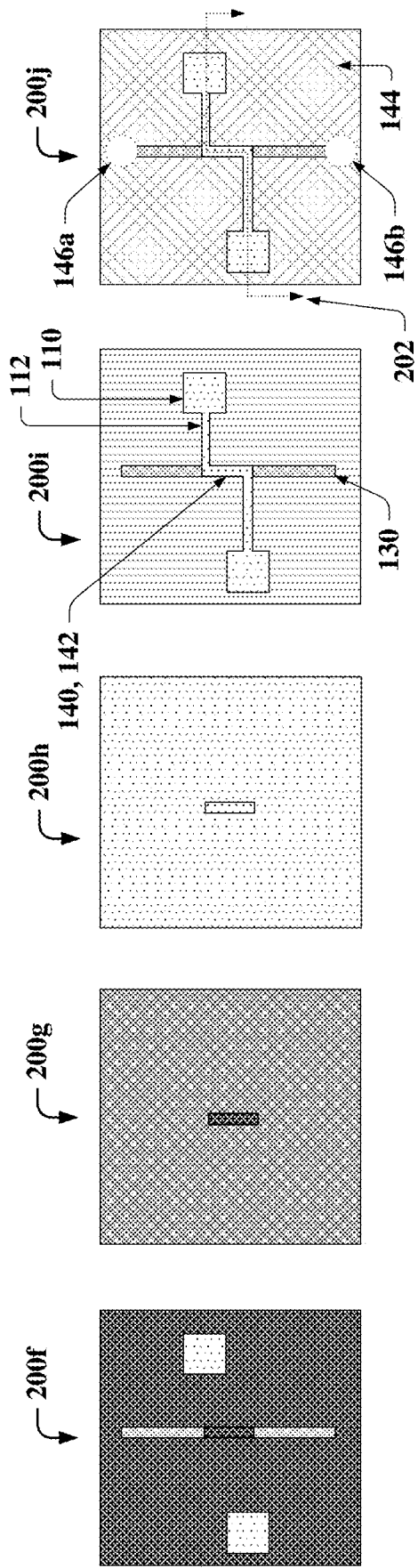

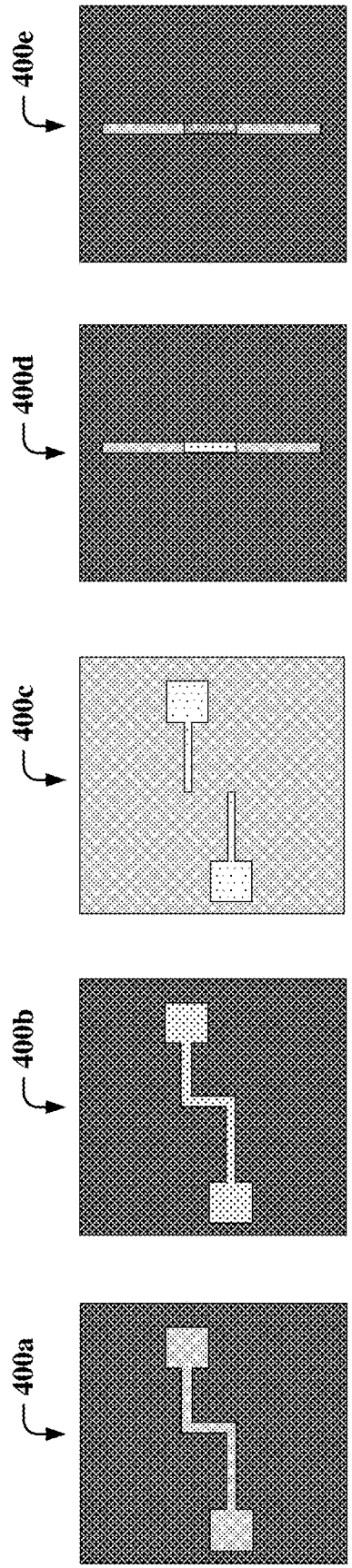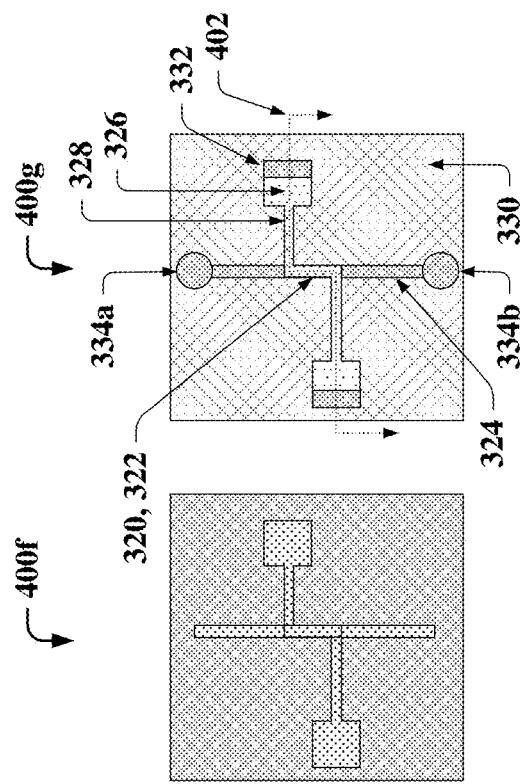
FIG. 4A  FIG. 4B  FIG. 4C  FIG. 4D  FIG. 4E  FIG. 4F  FIG. 4G

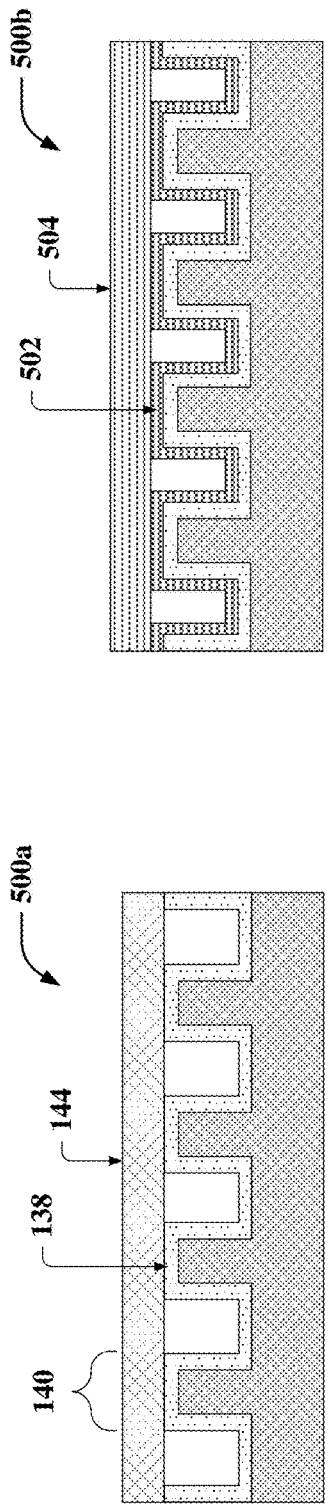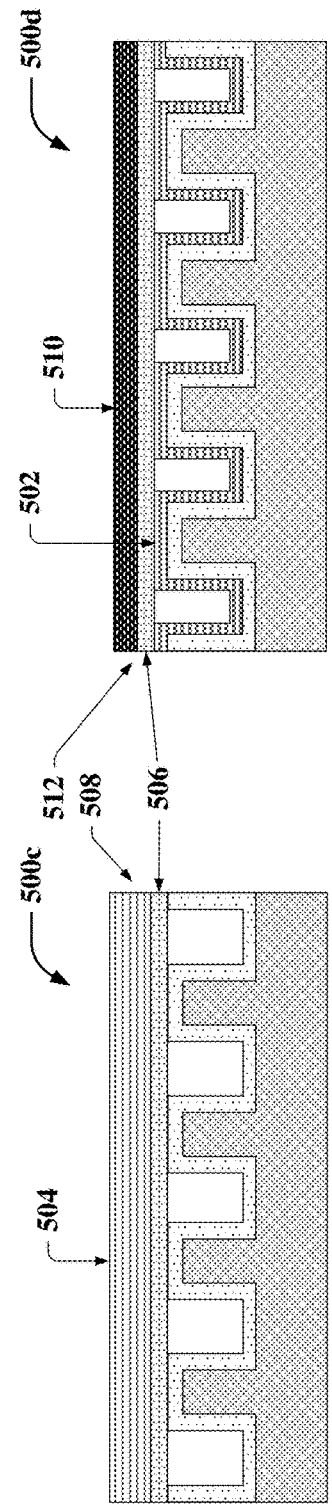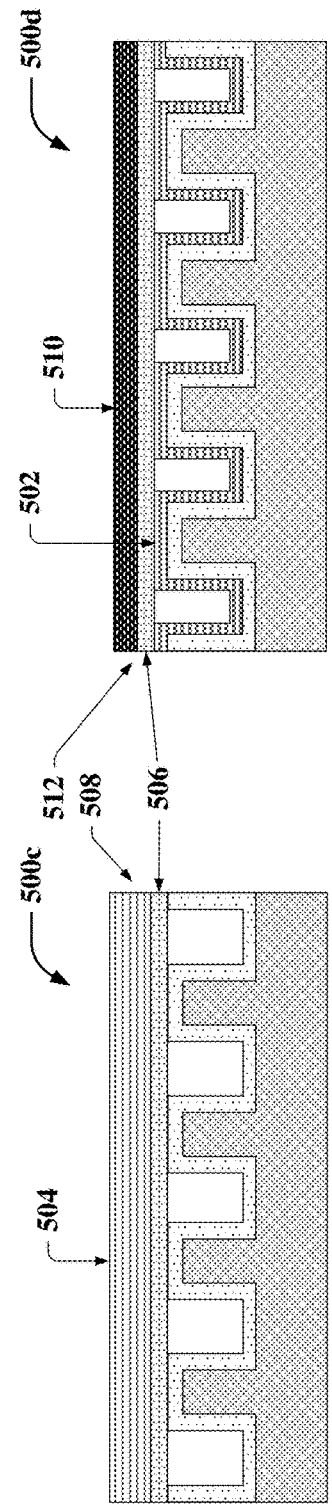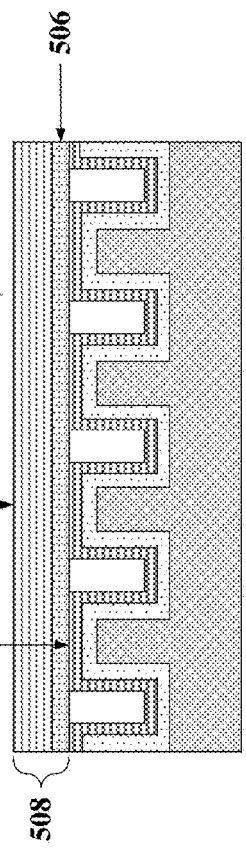

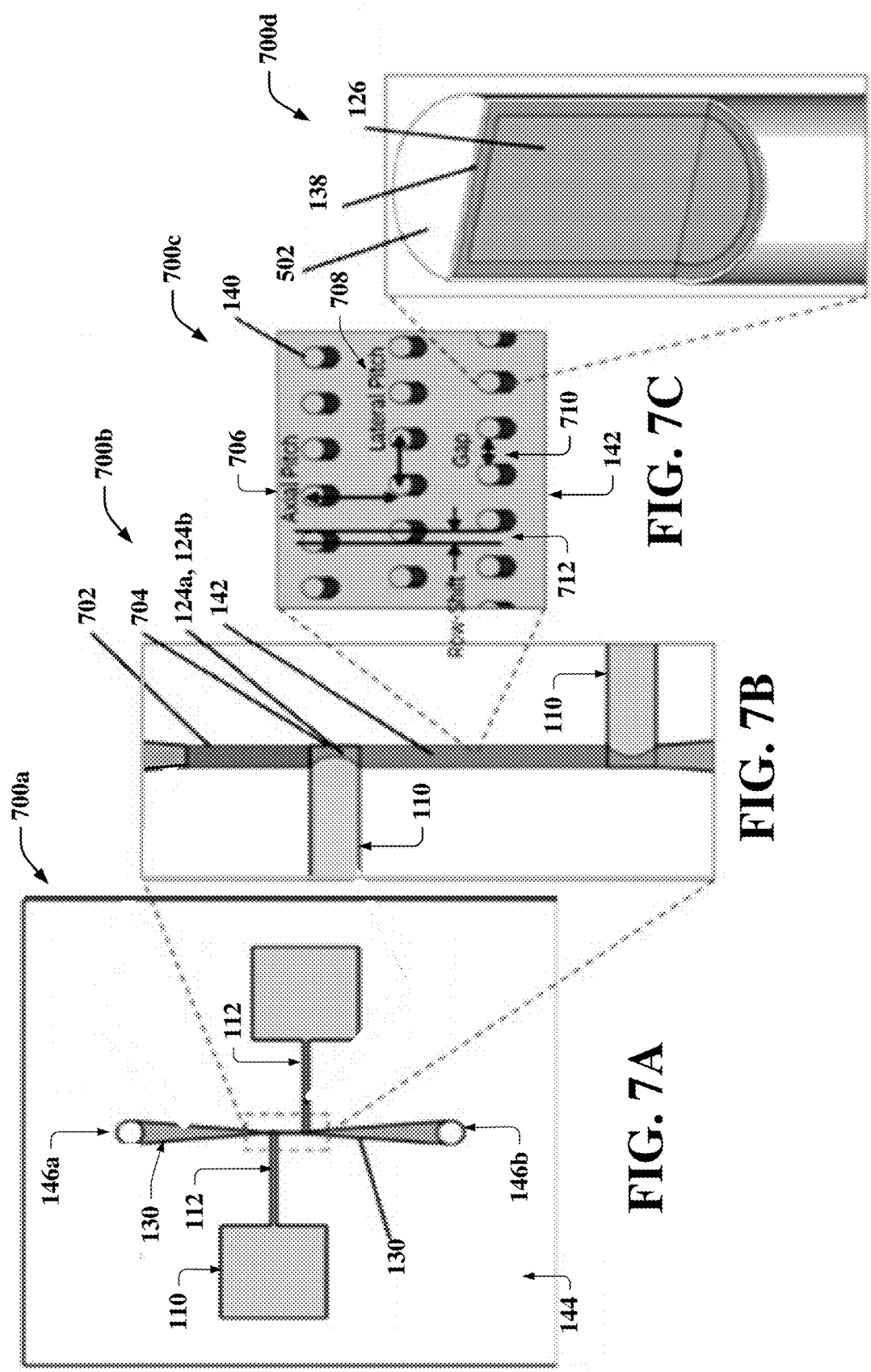

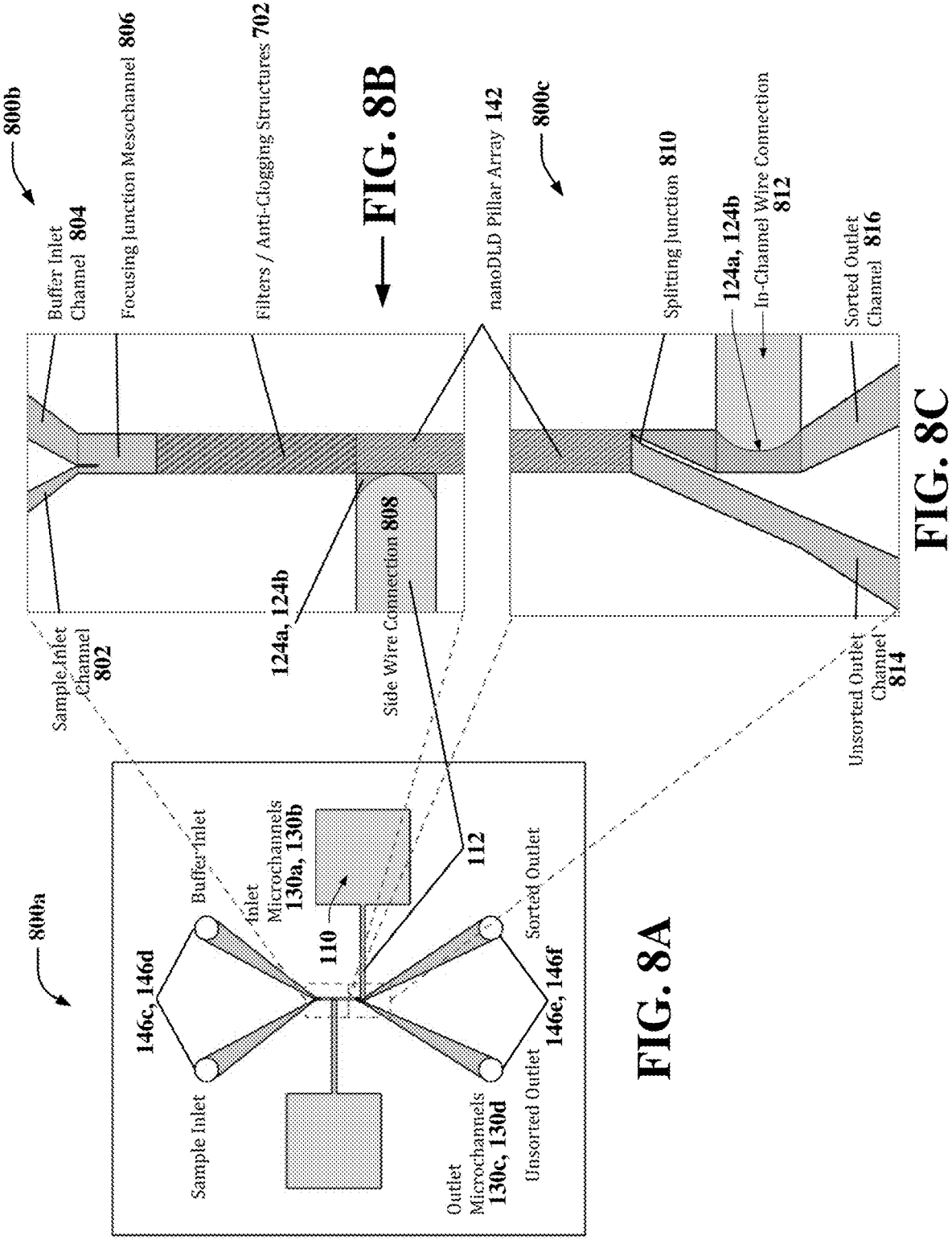

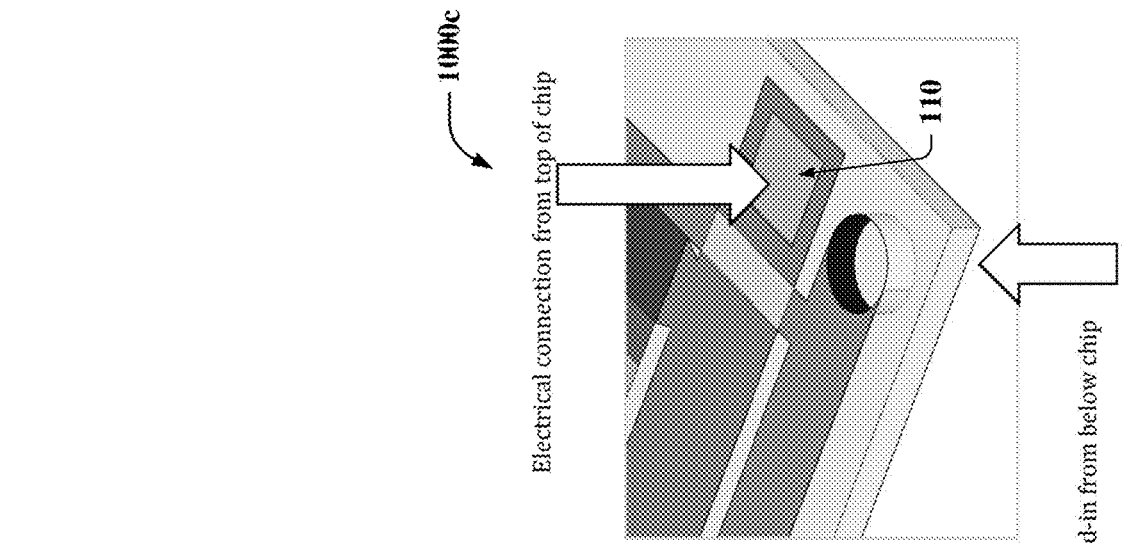
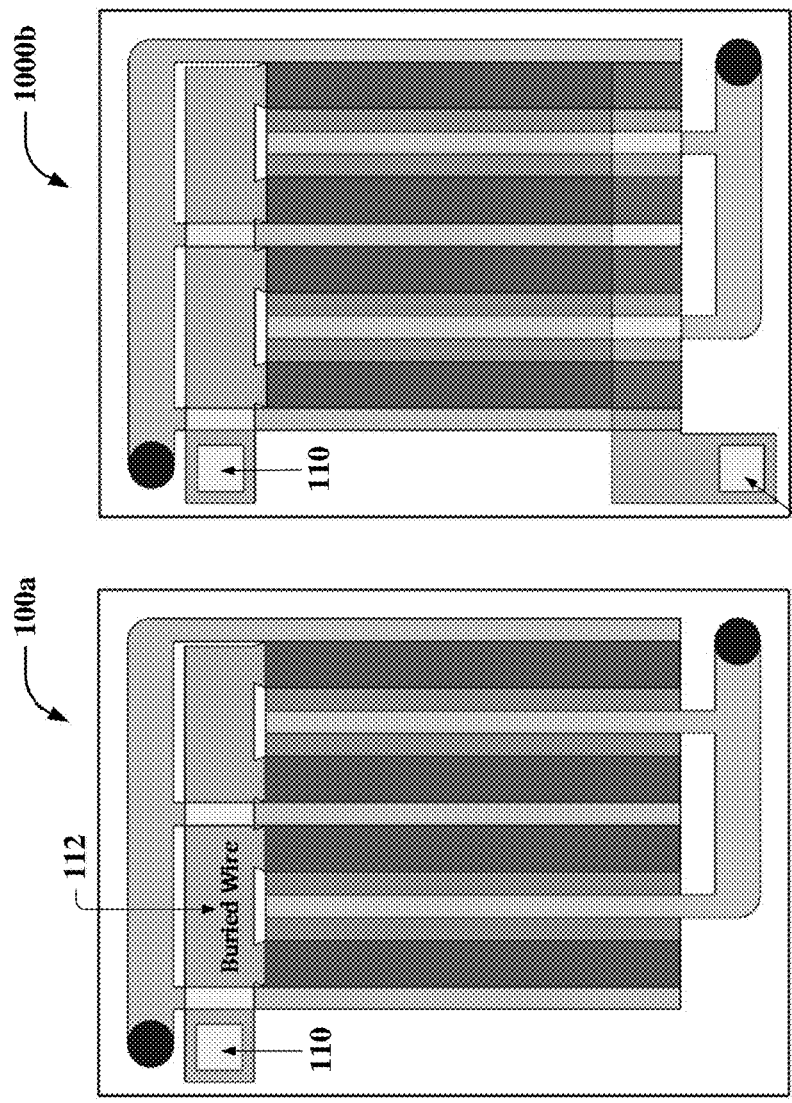
FIG. 10A Single Contact
FIG. 10B Double Contact
FIG. 10C

ELECTRICALLY CONDUCTIVE DETERMINISTIC LATERAL DISPLACEMENT ARRAY IN A SEMICONDUCTOR DEVICE

BACKGROUND

The subject disclosure relates to a periodic fluidic ratchet device and a method for forming the same. More specifically, the subject disclosure relates to an electrically conductive deterministic lateral displacement array device and a method for forming the same.

Periodic fluidic ratchets are mechanisms that can separate and/or sort particles in a fluid stream based on size, morphology, and/or mechanical properties of such particles. Periodic fluidic ratchets can comprise lattices of pillar features built into a fluidic channel such that the pillar lattice is off-axis from the channel. The asymmetric orientation of the resulting lattice leads to a selection criterion in which different sized particles are displaced favorably to one side of a pillar or another. A key design feature is the pitch between pillar features which, combined with the pillar feature sizes, defines the gap between such pillar features. The gap size influences the size selection criterion as well as the output performance of the ratchet. Common types of fluidic ratchets are deterministic lateral displacement (DLD) arrays, directional mode locking arrays, and asymmetric slit arrays. DLD systems in particular have been scaled from macroscopic down to the nanoscale (nanoDLD), where the gap sizes approach 10's nanometers (nm) to 100's nm. NanoDLD systems have the potential to separate colloidal material down to 20 nm based only on gap size.

A problem with existing periodic fluidic ratchet devices is that size scaling of the pillar arrays of such devices to achieve smaller particle size selectivity is limited by increasing fluidic resistance, as well as practical issues of fabrication. Another problem with existing periodic fluidic ratchet devices is that size selectivity presents only a single dimension for separation.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, methods, computer-implemented methods, apparatus, and/or computer program products that can facilitate electrically conductive deterministic lateral displacement (DLD) pillar array components are described.

According to an embodiment, a device can comprise a substrate that can have a channel that can comprise electrically conductive pillar components that can be coupled to one or more electrodes. The device can further comprise a seal layer that can be coupled to the substrate that seals the one or more electrodes. An advantage of such a device is that it can facilitate separation of fluid particles having diameters of 20 nm or smaller.

In another embodiment, the electrically conductive pillar components can be arranged as an asymmetric array in the channel. An advantage of such a device is that it can facilitate generating and/or sensing electric fields within the asymmetric array, thereby enabling control sensing and separation of particles based on charge.

According to an embodiment, a method can comprise forming electrically conductive pillar components inside a channel of a substrate. The method can further comprise coupling the electrically conductive pillar components to one or more electrodes of the substrate. An advantage of such a method is that it can facilitate scalable fabrication of electrically conductive periodic fluidic ratchet (e.g., DLD) devices using established silicon lithography technology.

In another embodiment, the method can further comprise forming an asymmetric array of the electrically conducting pillar components inside the channel. An advantage of such a method is that it can facilitate generating and/or sensing electric fields within the asymmetric array, thereby enabling control sensing and separation of particles based on charge.

According to an embodiment, a method can comprise etching one or more electrodes and a channel having electrically conductive pillar components into a dopant layer of a substrate. The method can further comprise coupling the electrically conductive pillar components to the one or more electrodes based on the etching. An advantage of such a method is that it can facilitate scalable fabrication of electrically conductive periodic fluidic ratchet (e.g., DLD) devices using established silicon lithography technology.

In another embodiment, the method can further comprise etching an asymmetric array of the electrically conducting pillar components inside the channel. An advantage of such a method is that it can facilitate generating and/or sensing electric fields within the asymmetric array, thereby enabling control sensing and separation of particles based on charge.

According to an embodiment, a device can comprise a fluidic channel that can transmit a fluid. The device can further comprise a deterministic lateral displacement array component that can be positioned inside the fluidic channel that can generate an electric field to deflect particles of the fluid. An advantage of such a device is that it can facilitate generating and/or sensing electric fields within the deterministic lateral displacement array component, thereby enabling control sensing and separation of particles based on charge.

In another embodiment, the deterministic lateral displacement array component can comprise an electrically conductive nano-scale deterministic lateral displacement array component. An advantage of such a device is that it can facilitate separation of fluid particles having diameters of 20 nm or smaller.

According to an embodiment, a method can comprise generating an electric field within an electrically conductive deterministic lateral displacement array component that can be positioned in a fluidic channel. The method can further comprise separating particles of a fluid based on the generating. An advantage of such a method is that it can facilitate generating and/or sensing electric fields within the asymmetric array, thereby enabling control sensing and separation of particles based on charge.

In another embodiment, the method can further comprise applying a voltage to the electrically conductive deterministic lateral displacement array component and an electrode coupled to the fluidic channel. The method can further comprise generating an electropotential between the electrically conductive deterministic lateral displacement array component and the fluid based on the applying. An advantage of such a method is that it can provide a second separation dimension for resolving particles of different electrical charges within the electrically conductive deterministic lateral displacement array component, thereby facilitating increased resolution capacity.

DESCRIPTION OF THE DRAWINGS

FIGS. 2A, 2B, 2C, 2D, 2E, 2F, 2G, 2H, 2I, and 2J illustrate top views of example, non-limiting devices that can facilitate electrically conductive deterministic lateral displacement (DLD) pillar array components in accordance with one or more embodiments described herein.

FIGS. 4A, 4B, 4C, 4D, 4E, 4F, and 4G illustrate top views of example, non-limiting devices that can facilitate electrically conductive deterministic lateral displacement (DLD) pillar array components in accordance with one or more embodiments described herein.

FIGS. 5A, 5B, 5C, 5D, and 5E illustrate cross-sectional side views of example, non-limiting devices that can facilitate electrically conductive deterministic lateral displacement (DLD) pillar array components in accordance with one or more embodiments described herein.

FIGS. 7A, 7B, and 7C illustrate top views of example, non-limiting devices that can facilitate electrically conductive deterministic lateral displacement (DLD) pillar array components in accordance with one or more embodiments described herein.

FIG. 7D illustrates an orthogonal cutaway view of an example, non-limiting device that can facilitate electrically conductive deterministic lateral displacement (DLD) pillar array components in accordance with one or more embodiments described herein.

FIGS. 8A, 8B, and 8C illustrate top views of example, non-limiting devices that can facilitate electrically conductive deterministic lateral displacement (DLD) pillar array components in accordance with one or more embodiments described herein.

FIGS. 10A and 10B illustrate top views of example, non-limiting devices that can facilitate electrically conductive deterministic lateral displacement (DLD) pillar array components in accordance with one or more embodiments described herein.

FIG. 10C illustrates an orthogonal view of an example, non-limiting device that can facilitate electrically conductive deterministic lateral displacement (DLD) pillar array components in accordance with one or more embodiments described herein.

DETAILED DESCRIPTION

Figure 1A:
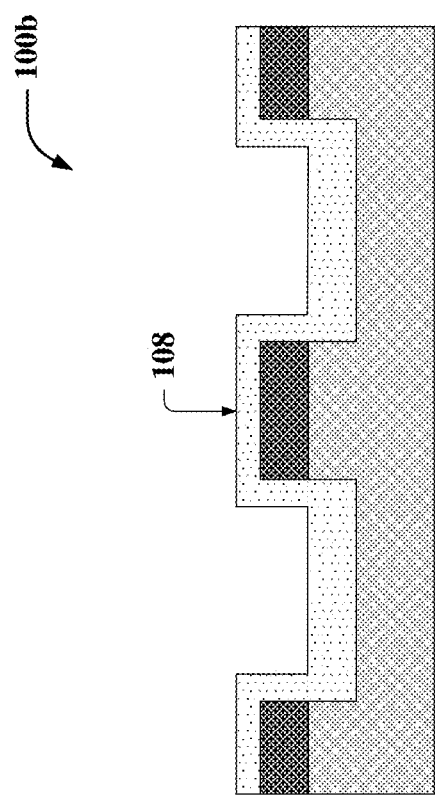
FIGS. 1A, 1B, 1C, 1D, 1E, 1F, 1G, 1H, 1I, and 1J illustrate cross-sectional side views of example, non-limiting devices that can facilitate electrically conductive deterministic lateral displacement (DLD) pillar array components in accordance with one or more embodiments described herein.
Figure 1B:
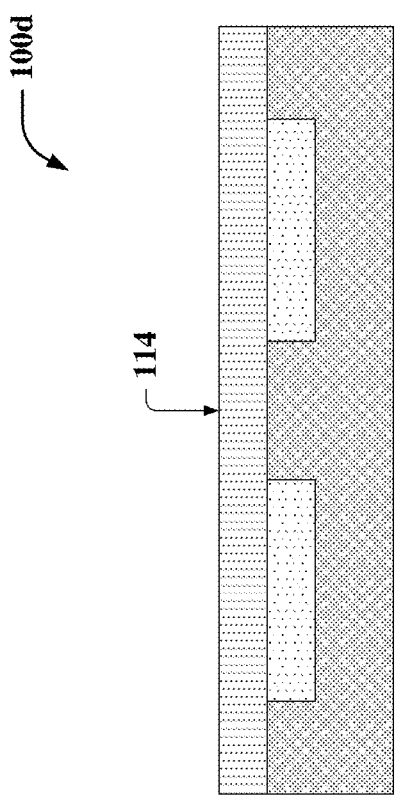
Figure 1C:
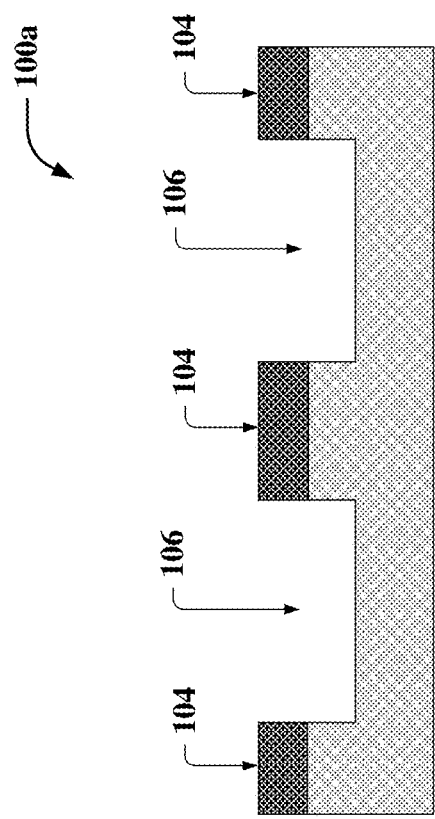
Figure 1D:
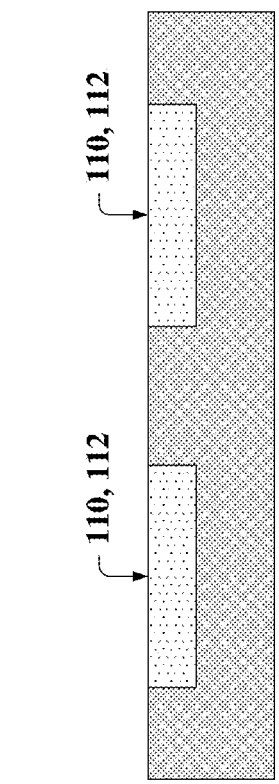

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. It is noted that the drawings of the present application are provided for illustrative purposes only and, as such, the drawings are not drawn to scale.

Given the above problem of existing periodic fluidic ratchet devices having size scaling limitations due to increased fluidic resistance, as well as practical issues of fabrication, the present disclosure can be implemented to produce a solution to this problem in the form of an electrically conductive DLD array device that can have a fluidic channel that can comprise electrically conductive pillar components that can generate an electrical field. An advantage of such a device is that it can be fabricated utilizing established semiconductor lithography processes. Another advantage of such a device is that it can facilitate separation of fluid particles having diameters of 20 nm or smaller.

Further, given the above problem with existing periodic fluidic ratchet devices having limited size selectivity based on a single dimension for separation, the present disclosure can be implemented to produce a solution to this problem in the form of an electrically conductive DLD array device that can have a fluidic channel that can comprise electrically conductive pillar components that can generate an electropotential based on an applied voltage. An advantage of such a device is that the application of such an electropotential provides a second separation dimension for resolving particles of different electrical charges within the electrically conductive DLD array device, thereby facilitating increased resolution capacity.

According to multiple embodiments, the subject disclosure described herein and/or illustrated in the figures can constitute one or more components of an integrated circuit fabricated in a semiconducting device. For example, the various embodiments of the subject disclosure described herein and/or illustrated in the figures can constitute one or more components of an integrated circuit fabricated in a semiconducting device that can be implemented in a periodic fluidic ratchet device including, but not limited to, a deterministic lateral displacement (DLD) array periodic fluidic ratchet device (e.g., a nano-scale DLD array device), a directional mode locking array periodic fluidic ratchet device, an asymmetric slit array fluidic ratchet device, and/or another periodic fluidic ratchet device.

As described below, fabrication of the various embodiments of the subject disclosure described herein and/or illustrated in the figures can comprise one or more multi-step sequences of, for example, photolithographic and/or chemical processing steps that facilitate gradual creation of electronic-based systems, devices, components, and/or circuits in a semiconducting device (e.g., an integrated circuit). For instance, the various embodiments of the subject disclosure described herein and/or illustrated in the figures can be fabricated by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, etc.), etching techniques (e.g., reactive ion etching (RIE), dry etching, wet etching, ion beam etching, plasma etching, laser ablation, etc.), evaporation techniques, sputtering techniques, plasma ashing techniques, thermal treatments (e.g., rapid thermal anneal, furnace anneals, thermal oxidation, etc.), physical vapor deposition (PVD), chemical vapor deposition (CVD), atomic layer deposition (ALD), plasma enhanced chemical vapor deposition (PECVD), chemical solution deposition, electroplating, molecular beam epitaxy (MBE), electrochemical deposition (ECD), lift-off techniques, chemical-mechanical planarization (CMP), backgrinding techniques, and/or another technique for fabricating an integrated circuit.

As described below, fabrication of the various embodiments of the subject disclosure described herein and/or illustrated in the figures can be fabricated using various materials. For example, the various embodiments of the subject disclosure described herein and/or illustrated in the figures can be fabricated using materials of one or more different material classes including, but not limited to: conductive materials, semiconducting materials, superconducting materials, dielectric materials, polymer materials, organic materials, inorganic materials, non-conductive materials, and/or another material that can be utilized with one or more of the techniques described above for fabricating an integrated circuit.

It will be understood that when an element as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

FIGS. 1A, 1B, 1C, 1D, 1E, 1F, 1G, 1H, 1I, and 1J illustrate cross-sectional side views of example, non-limiting devices 100a-100j that can facilitate electrically conductive deterministic lateral displacement (DLD) pillar array components in accordance with one or more embodiments described herein. FIGS. 1A, 1B, 1C, 1D, 1E, 1F, 1G, 1H, 1I, and 1J illustrate an example, non-limiting multi-step fabrication sequence that can be implemented to fabricate one or more embodiments (e.g., devices 100a-100j) of the subject disclosure described herein and/or illustrated in the figures. For example, the non-limiting multi-step fabrication sequence illustrated in FIGS. 1A, 1B, 1C, 1D, 1E, 1F, 1G, 1H, 1I, and 1J can be implemented to fabricate a metal based electrically conductive DLD pillar array device (e.g., device 100j depicted in FIG. 1J) that can be employed in a periodic fluidic ratchet device in accordance with one or more embodiments described herein. Repetitive description of like elements and/or processes employed in various embodiments described herein is omitted for sake of brevity.

According to multiple embodiments, device 100a (FIG. 1A) can comprise a substrate 102 having a photoresist layer 104 formed and patterned thereon, where substrate 102 can comprise one or more openings 106. In some embodiments, substrate 102 can comprise a semiconductor material. For example, substrate 102 can comprise a dielectric material including, but not limited to, silicon (Si), silicon dioxide ($SiO_2$), sapphire (e.g., aluminum oxide ($Al_2O_3$)), and/or another dielectric semiconductor or insulator material. In some embodiments, substrate 102 can comprise any thickness that ensures mechanical stability of all material layers and/or components coupled to substrate 102. In some embodiments, substrate 102 can comprise a thickness that can vary depending upon the type of dielectric material(s) used. For example, substrate 102 can be ground (e.g., via backgrinding) to a thickness (e.g., height) ranging from 50 micrometers (μm)-700 μm.

In some embodiments, one or more openings 106 can be formed into substrate 102 utilizing a patterning process. For example, such a patterning process can be implemented using lithography and etching techniques comprising: forming photoresist layer 104 atop substrate 102; exposing photoresist layer 104 to a desired pattern of radiation; and developing the exposed photoresist of photoresist layer 104 utilizing a conventional resist developer. In some embodiments, photoresist layer 104 can comprise a positive-tone photoresist, a negative-tone photoresist, a hybrid-tone photoresist, and/or another photoresist. In some embodiments, an etching process can be employed to form one or more openings 106. For example, such etching process can comprise a dry etching process (e.g., reactive ion etching (RIE), ion beam etching, plasma etching, laser ablation, etc.) and/or a wet chemical etching process.

According to multiple embodiments, device 100b (FIG. 1B) can comprise an alternative embodiment of device 100a after formation of a metal layer 108 on physically exposed surfaces of substrate 102 (e.g., bottom and/or sidewall surfaces of openings 106) and/or photoresist layer 104. In some embodiments, metal layer 108 can be formed on (e.g., chemically and/or mechanically coupled to) physically exposed surfaces of substrate 102 (e.g., bottom and/or sidewall surfaces of openings 106) and/or photoresist layer 104 utilizing one or more deposition processes (e.g., PVD, CVD, ALD, PECVD, etc.). In some embodiments, metal layer 108 can comprise an electrically conductive metal layer constituting one or more metal contact pads and/or one or more metal wires (e.g., metal contact pads 110 and metal wires 112 depicted in FIGS. 1C and 2J). In some embodiments, metal contact pads 110 and/or metal wires 112 can constitute electrodes that can facilitate electrically coupling electrically conductive pillars and/or an electrically conductive pillar array (e.g., electrically conductive pillars 140 and/or electrically conductive pillar array 142 depicted in FIG. 1I) to an electrical power source (e.g., a voltage and/or current source as described below with reference to FIGS. 6A, 6B, and 6D). In some embodiments, metal layer 108 can comprise metallic materials including, but not limited to, tungsten (W), titanium nitride (TiN), platinum (Pt), palladium (Pd), gold (Au), silver (Ag), copper (Cu), and/or another metallic material.

According to multiple embodiments, device 100c (FIG. 1C) can comprise an alternative embodiment of device 100b after removing portions of metal layer 108 and photoresist layer 104 from horizontal surfaces of substrate 102, while maintaining portions of metal layer 108 formed in openings 106. In these embodiments, such removal of metal layer 108 as described above can provide device 100c comprising a physically exposed top horizontal surface of substrate 102, one or more metal contact pads 110, and/or one or more metal wires 112. In some embodiments, metal contact pads 110 and/or metal wires 112 can comprise any thickness that can minimize electrical resistance drop. For example, metal contact pads 110 and/or metal wires 112 can comprise a thickness (e.g., height) ranging from 0.01 µm-50 µm. In some embodiments, such portions of metal layer 108 and photoresist layer 104 can be removed from horizontal surfaces of substrate 102 by employing one or more material removal processes (e.g., a lift-off process (e.g., washing out photoresist layer 104 and portions of metal layer 108), RIE, dry etching, wet etching, ion beam etching, plasma etching, laser ablation, CMP, etc.).

According to multiple embodiments, device 100d (FIG. 1D) can comprise an alternative embodiment of device 100c after formation of an oxide layer 114 on physically exposed surfaces of substrate 102, metal contact pads 110, and/or metal wires 112. In some embodiments, oxide layer 114 can be formed on (e.g., chemically and/or mechanically coupled to) physically exposed surfaces of substrate 102, metal contact pads 110, and/or metal wires 112 utilizing one or more deposition processes (e.g., PVD, CVD, ALD, PECVD, etc.). In some embodiments, oxide layer 114 can comprise silicon dioxide ($SiO_2$), zinc oxide (ZnO), and/or another material. In some embodiments, oxide layer 114 can constitute a seal layer that seals (e.g., via a leak proof seal) metal contact pads 110 and/or metal wires 112. In some embodiments, oxide layer 114 can constitute a hard (e.g., solid) masking layer into which various features can be formed (e.g., pillars 126, pillar array 128, fluidic channel 130, and/or openings 132 described below with reference to FIG. 1F) and/or onto which various materials can be deposited. In some embodiments, oxide layer 114 can comprise any thickness that can facilitate fully covering and conforming over metal contact pads 110 and/or metal wires 112 such that oxide layer 114 provides a leak proof seal (e.g., a water, solvent, and/or colloid leak proof seal) around metal contact pads 110 and/or metal wires 112. For example, oxide layer 114 can comprise a thickness (e.g., height) ranging from 0.01 µm-10 µm. In some embodiments, a planarization (e.g., CMP) process can be employed to provide a uniform (e.g., flat, void-free) top surface of oxide layer 114 upon which a photoresist patterning layer can be formed.

According to multiple embodiments, device 100e (FIG. 1E) can comprise an alternative embodiment of device 100d after forming and patterning a photoresist layer 116 on a physically exposed top surface of oxide layer 114. In some embodiments, photoresist layer 116 can comprise the same photoresist as photoresist layer 104 described above (e.g., positive-tone photoresist, negative-tone photoresist, hybrid-tone photoresist, etc.). In some embodiments, photoresist layer 116 can be formed and patterned utilizing the same lithography techniques described above to form and pattern photoresist layer 104 (e.g., forming photoresist layer 116 atop oxide layer 114, exposing photoresist layer 116 to a desired pattern of radiation, and developing the exposed photoresist of photoresist layer 116 utilizing a conventional resist developer).

Figure 1E:
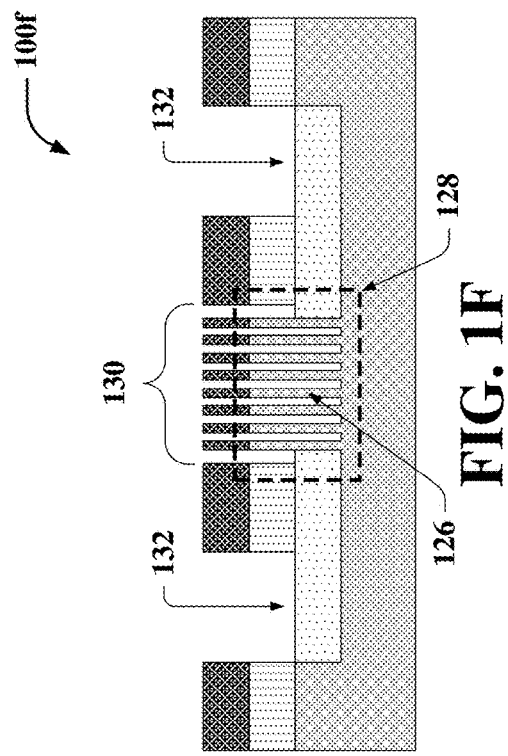

In some embodiments, photoresist layer 116 can be formed and patterned on the top surface of oxide layer 114 such that photoresist layer 116 comprises a patterned fluidic channel 118, a patterned pillar array 120, and/or one or more patterned openings 122. In some embodiments, photoresist layer 116 can be formed and patterned on the top surface of oxide layer 114 such that patterned fluidic channel 118 overlaps metal wires 112 (e.g., as illustrated by overlap sections 124a depicted in FIGS. 1E and 7B). In some embodiments, photoresist layer 116 can be formed and patterned on the top surface of oxide layer 114 such that patterned pillar array 120 is located inside patterned fluidic channel 118 (e.g., as depicted in FIG. 1E). In some embodiments, photoresist layer 116 can be formed and patterned on the top surface of oxide layer 114 such that patterned pillar array 120 comprises pillar components (e.g., pillars 126 and/or electrically conductive pillars 140 described below with reference to FIGS. 1F and 1I, respectively) that comprise a substantially cylindrical shape, pyramidic shape, and/or another shape. In some embodiments, photoresist layer 116 can be formed and patterned on the top surface of oxide layer 114 such that patterned pillar array 120 comprises pillar components (e.g., pillars 126 and/or electrically conductive pillars 140 described below with reference to FIGS. 1F and 1I, respectively) that are arranged with a translational offset in an asymmetric array (e.g., as illustrated by electrically conductive pillar array 142 depicted in FIG. 7C). In these embodiments, such an asymmetric array of pillar components can facilitate lateral displacement of particles in a fluid (e.g., colloid material).

Figure 1F:
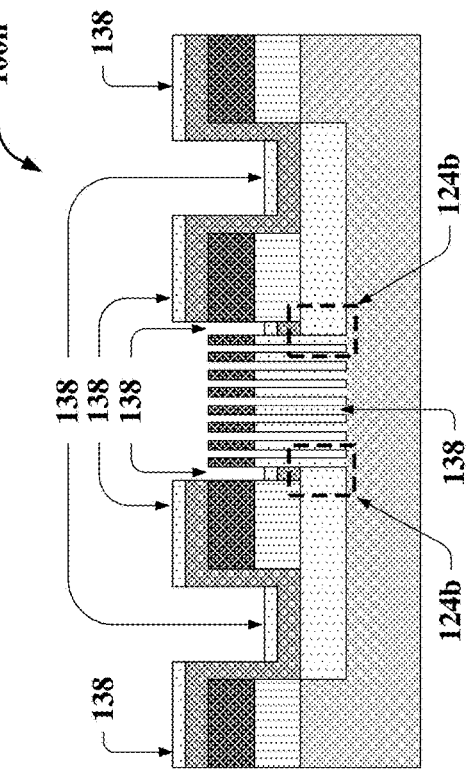
Figure 1G:
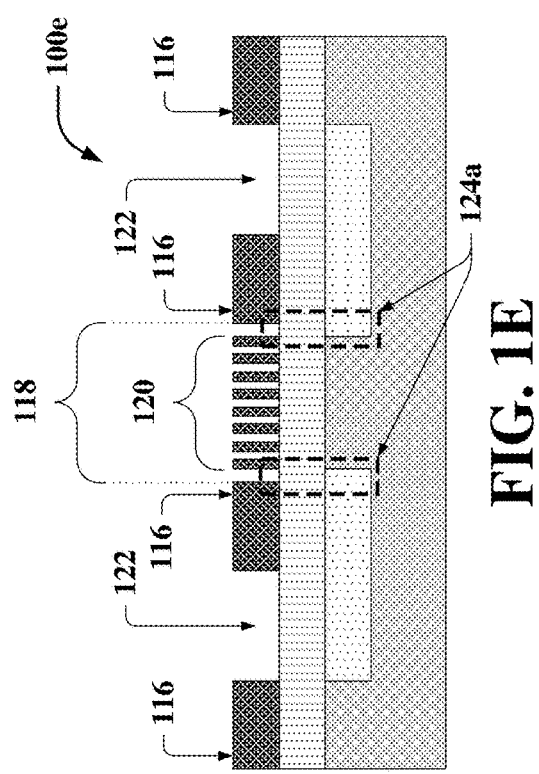
Figure 1H:
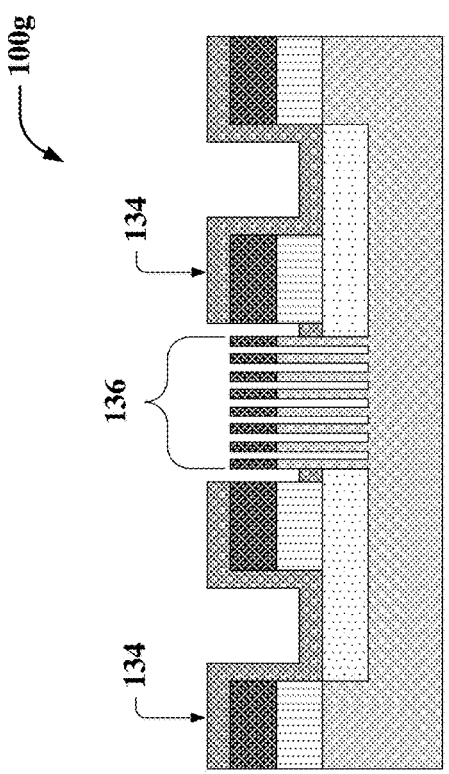
Figure 1J:
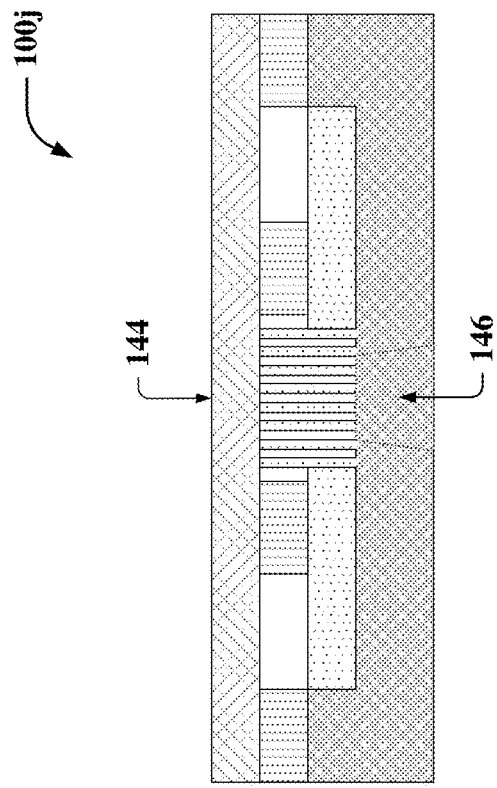

According to multiple embodiments, device 100f (FIG. 1F) can comprise an alternative embodiment of device 100e after removing portions of oxide layer 114 and substrate 102 (e.g., as illustrated in FIG. 1F) to form one or more pillars 126, a pillar array 128, a fluidic channel 130, and/or one or more openings 132, while maintaining metal contact pads 110 and metal wires 112. In such embodiments, one or more pillars 126 and/or pillar array 128 can be located inside (e.g., formed inside) fluidic channel 130 (e.g., as illustrated in FIG. 1F). In these embodiments, such portions of oxide layer 114 and substrate 102 can be removed by employing one or more etching processes (e.g., RIE, dry etching, wet etching, ion beam etching, plasma etching, laser ablation, etc.).

According to multiple embodiments, device 100g (FIG. 1G) can comprise an alternative embodiment of device 100f after forming a photoresist layer 134 on a physically exposed top surfaces of metal contact pads 110, metal wires 112, and photoresist layer 116, as well as physically exposed side surfaces of oxide layer 114 and photoresist layer 116 (e.g., sidewalls of openings 132). In some embodiments, photoresist layer 134 can comprise the same photoresist as photoresist layers 104, 116 described above (e.g., positive-tone photoresist, negative-tone photoresist, hybrid-tone photoresist, etc.). In some embodiments, photoresist layer 134 can be formed and patterned utilizing the same lithography techniques described above to form and pattern photoresist layers 104, 116 (e.g., forming photoresist layer 134 on the physically exposed horizontal and vertical surfaces described above, exposing photoresist layer 134 to a desired pattern of radiation, and developing the exposed photoresist of photoresist layer 134 utilizing a conventional resist developer). In some embodiments, photoresist layer 134 can be formed and patterned on the physically exposed horizontal and vertical surfaces described above such that a window 136 can be formed to enable surfaces of pillars 126 and/or pillar array 128 to remain physically exposed (e.g., photoresist layer 134 is not formed on such components).

According to multiple embodiments, device 100h (FIG. 1H) can comprise an alternative embodiment of device 100g after formation of a thin metal layer 138 on physically exposed surfaces of pillars 126 and/or pillar array 128. In some embodiments, thin metal layer 138 can be formed on (e.g., chemically and/or mechanically coupled to) physically exposed surfaces of pillars 126 and/or pillar array 128 (e.g., via window 136) utilizing one or more deposition processes (e.g., PVD, CVD, ALD, PECVD, etc.). In some embodiments, thin metal layer 138 can be formed on pillars 126 and/or pillar array 128 (e.g., via window 136) utilizing ALD. In some embodiments, thin metal layer 138 can comprise an electrically conductive metal layer that can overlap metal wires 112, pillars 126, and/or pillar array 128, thereby facilitating electrical coupling of metal wires 112 to pillars 126 and/or pillar array 128 (e.g., as illustrated in FIG. 7B). For example, thin metal layer 138 can be formed on physically exposed sidewall surfaces of metal wires 112, as well as and all physically exposed surfaces of pillars 126 and/or pillar array 128 (e.g., as depicted by overlap sections 124b in FIG. 1H).

Figure 1I:
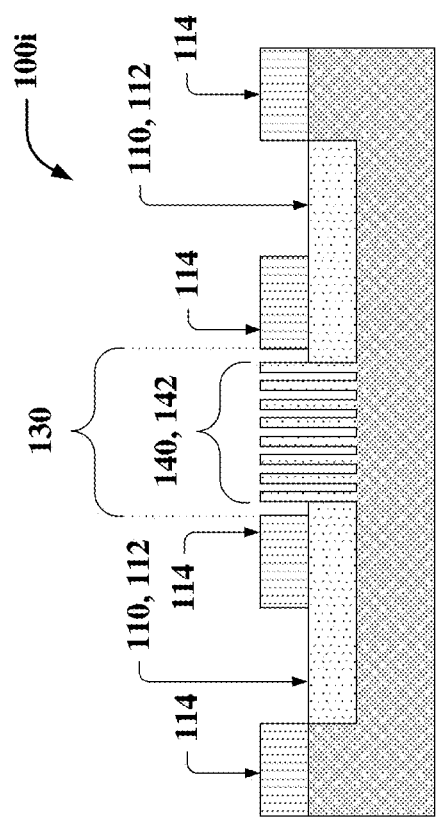

In some embodiments, based on formation of thin metal layer 138 on pillars 126 and/or pillar array 128, pillars 126 and/or pillar array 128 can thereafter constitute electrically conductive pillars 140 and an electrically conductive pillar array 142, respectively (e.g., depicted in FIG. 1I). In some embodiments, metal layer 108 can comprise metallic materials including, but not limited to, tungsten (W), titanium nitride (TiN), platinum (Pt), palladium (Pd), gold (Au), silver (Ag), copper (Cu), and/or another metallic material. In some embodiments, thin metal layer 138 can comprise a thickness (e.g., height) ranging from 0.01-μm-50 μm.

In some embodiments (not illustrated in FIG. 1H), formation of a conductive silicide layer after deposition of thin metal layer 138 can be performed by annealing substrate 102, pillars 126, and/or pillar array 128, thereby facilitating reaction of thin metal layer 138 with substrate 102, pillars 126, and/or pillar array 128. In such embodiments, any surface oxide on pillars 126 and/or pillar array 128 must be etched away to provide a clean metal/silicon interface. In these embodiments, such a conductive silicide layer can comprise metallic materials including, but not limited to, tungsten (W), nickel (Ni), cobalt (Co), molybdenum (Mo), tantalum (Ta), platinum (Pt), and/or another metallic material.

According to multiple embodiments, device 100i (FIG. 1I) can comprise an alternative embodiment of device 100h after removing thin metal layer 138, photoresist layer 134, and photoresist layer 116 from surfaces of oxide layer 114, metal contact pads 110, metal wires 112, pillars 126, pillar array 128, and fluidic channel 130. In some embodiments, such removal of thin metal layer 138 as described above can be performed utilizing one or more material removal processes (e.g., a lift-off process (e.g., washing out photoresist layer 104 and portions of metal layer 108)), RIE, dry etching, wet etching, ion beam etching, plasma etching, laser ablation, CMP, etc.). In some embodiments, such removal of thin metal layer 138 as described above can provide device 100i comprising physically exposed top horizontal surfaces of oxide layer 114 and/or electrically conductive pillars 140.

In some embodiments, a thin oxide layer (e.g., thin oxide layer 502 depicted in FIGS. 5B, 5D, and 5E) can be deposited on physically exposed surfaces of electrically conductive pillars 140 utilizing ALD to coat thin metal layer 138 formed on electrically conductive pillars 140. In these embodiments, such a thin oxide layer (e.g., thin oxide layer 502) can provide a surface on which to form a strong bond with an encapsulation layer that can seal fluidic channel 130 and/or device 100i (e.g., encapsulation layer 144 described below with reference to FIG. 1J). In these embodiments, such a thin oxide layer (e.g., thin oxide layer 502) can serve as an electrical insulating layer to prevent a short circuit between electrically conductive pillars 140 and an electrically conductive encapsulation layer and/or encapsulation component that can be bonded to device 100i (e.g., encapsulation component 512 described below with reference to FIG. 5D).

According to multiple embodiments, device 100j (FIG. 1J) can comprise an alternative embodiment of device 100i after formation of: an encapsulation layer 144 on physically exposed horizontal top surfaces of oxide layer 114 and/or electrically conductive pillars 140; and one or more ports 146 (e.g., input port 146a and output port 146b depicted in FIG. 2J). In some embodiments, encapsulation layer 144 can comprise an encapsulation component (e.g., encapsulation components 508, 512 depicted in FIGS. 5C and 5D, respectively) that can comprise multiple encapsulation layers that can seal fluidic channel 130 and/or device 100i (or alternative embodiments thereof as described below with reference to FIGS. 5B, 5C, 5D, and 5E). In some embodiments, encapsulation layer 144 can comprise a coverslip (e.g., glass, doped borosilicate, etc.) that can be positioned on physically exposed horizontal top surfaces of device 100i (e.g., physically exposed horizontal top surfaces of oxide layer 114 and electrically conductive pillars 140). In some embodiments, encapsulation layer 144 can be bonded to such surfaces of device 100i (e.g., surfaces of oxide layer 114 and electrically conductive pillars 140) by employing thermal compressive bonding, anodic bonding, and/or another bonding technique. In some embodiments, encapsulation layer 144 can comprise a thickness (e.g., height) ranging from 1 μm-1000 μm.

Figure 6C:
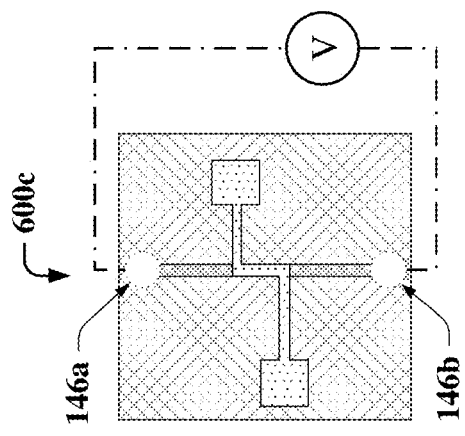
FIGS. 6A, 6B, and 6C illustrate top views of example, non-limiting devices that can facilitate electrically conductive deterministic lateral displacement (DLD) pillar array components in accordance with one or more embodiments described herein.

In some embodiments (not illustrated in FIG. 1J), encapsulation layer 144 can comprise one or more cut-outs that can be aligned over metal contact pads 110 to provide direct access to electrically wire device 100j to an electrical power source (e.g., a voltage and/or current source as described below with reference to FIGS. 6A, 6B, and 6D). In some embodiments (not illustrated in FIG. 1J), encapsulation layer 144 can comprise one or more cut-outs (e.g., ports) that can be aligned over fluidic channel 130 to provide connection to fluidic channel 130 (e.g., electrical connection and/or fluidic connection as depicted in FIGS. 6A and 6C).

In some embodiments, one or more ports 146 can be formed through substrate 102 (e.g., input port 146a and output port 146b depicted in FIG. 2J). For example, one or more ports 146 can comprise through-surface vias (TSV) that can be formed through substrate 102 utilizing one or more lithography and etching processes described above. In some embodiments, ports 146 can be aligned with fluidic channel 130 to provide connection to fluidic channel 130 (e.g., electrical connection and/or fluidic connection as depicted in FIGS. 6A and 6C). In some embodiments, ports 146 can facilitate inputting (e.g., introducing) and outputting (e.g., removing) fluid through device 100j, where such fluid can flow through device 100j via fluidic channel 130 and/or electrically conductive pillar array 142. In some embodiments, such fluid can comprise a solvent, a colloid, and/or another type of fluid comprising particles that can be separated from the fluid via electrically conductive pillars 140 and/or electrically conductive pillar array 142.

FIGS. 2A, 2B, 2C, 2D, 2E, 2F, 2G, 2H, 2I, and 2J illustrate top views of example, non-limiting devices 200a-200j that can facilitate electrically conductive deterministic lateral displacement (DLD) pillar array components in accordance with one or more embodiments described herein. Repetitive description of like elements and/or processes employed in various embodiments described herein is omitted for sake of brevity.

According to multiple embodiments, FIGS. 2A, 2B, 2C, 2D, 2E, 2F, 2G, 2H, 2I, and 2J can comprise top views of the example, non-limiting devices 100a-100j described above with reference to FIGS. 1A, 1B, 1C, 1D, 1E, 1F, 1G, 1H, 1I, and 1J. For example, devices 200a, 200b, 200c, 200d, 200e, 200f, 200g, 200h, 200i, 200j can comprise the example, non-limiting devices 100a, 100b, 100c, 100d, 100e, 100f, 100g, 100h, 100i, 100j, respectively. In FIG. 2J, dashed line 202 indicates where the cross-sectional side view of device 100j occurs relative to device 200j. In FIGS. 2A, 2B, 2C, 2D, 2E, 2F, 2G, 2H, and 2I, dashed line 202 is omitted for purposes of clarity.

In some embodiments, devices 200a-200j can comprise a footprint area (e.g., width×length) ranging from, for example, approximately 10 millimeters (mm)×10 mm to approximately 30 mm×26 mm. In some embodiments, metal contact pads 110 can comprise a footprint area that can facilitate electrical contact such as, for example, a footprint area ranging from approximately 1 mm×1 mm to approximately 5 mm×5 mm. In some embodiments, metal wires 112 can comprise a width that can facilitate minimum electrical resistance drop such as, for example, a width ranging from approximately 10 μm to approximately 100 μm. In some embodiments, electrically conductive pillars 140 can comprise a diameter ranging from, for example, approximately 0.05 μm to approximately 1.0 μm. In some embodiments, fluidic channel 130 and/or electrically conductive pillar array 142 can comprise a width that can range from, for example, approximately 20 μm to approximately 500 μm. In some embodiments, fluidic channel 130 and/or electrically conductive pillar array 142 can comprise a depth that can range from, for example, approximately 0.1 μm to approximately 1.0 μm. In some embodiments, electrically conductive pillar array 142 can comprise a length that can range from, for example, approximately 5 times (5×) to approximately 20 times (20×) the width of fluidic channel 130 and/or electrically conductive pillar array 142. In some embodiments, fluidic channel 130 can comprise any length that can limit hydrodynamic resistance. In some embodiments, the distance between input port 146a and output port 146b can range from, for example, approximately 2 mm to approximately 10 mm.

FIGS. 3A, 3B, 3C, 3D, 3E, 3F, and 3G illustrate cross-sectional side views of example, non-limiting devices 300a-300g that can facilitate electrically conductive deterministic lateral displacement (DLD) pillar array components in accordance with one or more embodiments described herein. FIGS. 3A, 3B, 3C, 3D, 3E, 3F, and 3G illustrate an example, non-limiting multi-step fabrication sequence that can be implemented to fabricate one or more embodiments (e.g., devices 300a-300g) of the subject disclosure described herein and/or illustrated in the figures. For example, the non-limiting multi-step fabrication sequence illustrated in FIGS. 3A, 3B, 3C, 3D, 3E, 3F, and 3G can be implemented to fabricate a doped substrate based electrically conductive DLD pillar array device (e.g., device 300g depicted in FIG. 3G) that can be employed in a periodic fluidic ratchet device in accordance with one or more embodiments described herein. Repetitive description of like elements and/or processes employed in various embodiments described herein is omitted for sake of brevity.

According to multiple embodiments, device 300a (FIG. 3A) can comprise a doped substrate 302 having an oxide layer 304 buried therein and a photoresist layer 306 formed and patterned thereon. In some embodiments, doped substrate 302 can comprise a silicon-on-insulator (SOI) semiconductor material (e.g., a multi-layered silicon-insulator-silicon (SOS) substrate). In some embodiments, doped substrate 302 can comprise a dielectric material such as, for instance, silicon (Si). In some embodiments, oxide layer 304 can comprise the same material(s) that can be used to form oxide layer 114 described above. In some embodiments, oxide layer 304 can comprise dielectric insulator material including, but not limited to, silicon dioxide ($SiO_2$) or another insulator material. In some embodiments, oxide layer 304 can comprise a dielectric insulator layer that can electrically isolate components of devices 300a-300g (e.g., electrically conductive doped pillars 320 described below with reference to FIG. 3E).

In some embodiments, doped substrate 302 and/or oxide layer 304 (e.g., combined or separate) can comprise any thickness that ensures mechanical stability of all material layers and/or components coupled to doped substrate 302. In some embodiments, doped substrate 302 and/or oxide layer 304 can comprise a thickness that can vary depending upon the type of dielectric material(s) used and/or dielectric insulator material(s) used, respectively. For example, doped substrate 302 and oxide layer 304 (e.g., combined) can be ground (e.g., via backgrinding) to a thickness (e.g., height) ranging from 1.0 μm-100 μm.

In some embodiments, photoresist layer 306 can be formed and patterned on a physically exposed top surface of doped substrate 302. In some embodiments, photoresist layer 306 can comprise the same photoresist as photoresist layer 104 described above (e.g., positive-tone photoresist, negative-tone photoresist, hybrid-tone photoresist, etc.). In some embodiments, photoresist layer 306 can be formed and patterned utilizing the same lithography techniques described above to form and pattern photoresist layer 104 (e.g., forming photoresist layer 306 atop doped substrate 302, exposing photoresist layer 306 to a desired pattern of radiation, and developing the exposed photoresist of photoresist layer 306 utilizing a conventional resist developer). In some embodiments, photoresist layer 306 can be formed and patterned on the top surface of doped substrate 302 such that photoresist layer 306 comprises a patterned opening 308. In such embodiments, patterned opening 308 can be define an area on the physically exposed horizontal top surface of doped substrate 302 into which a doping agent can be implanted and activated (e.g., as described below with reference to FIG. 3B).

Figure 3A:
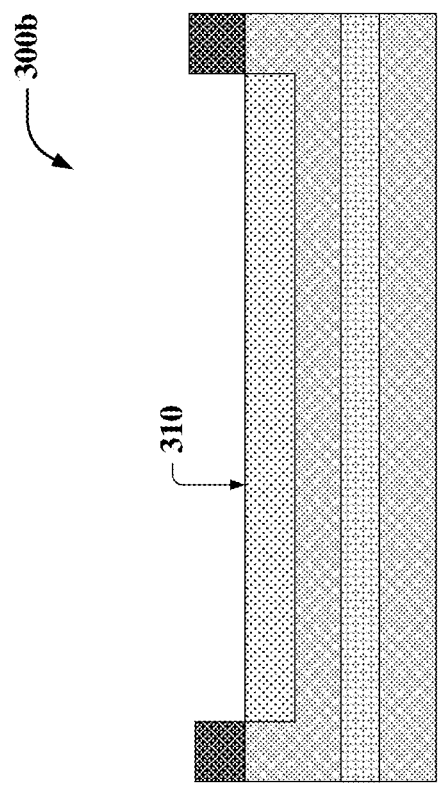
FIGS. 3A, 3B, 3C, 3D, 3E, 3F, and 3G illustrate cross-sectional side views of example, non-limiting devices that can facilitate electrically conductive deterministic lateral displacement (DLD) pillar array components in accordance with one or more embodiments described herein.
Figure 3B:
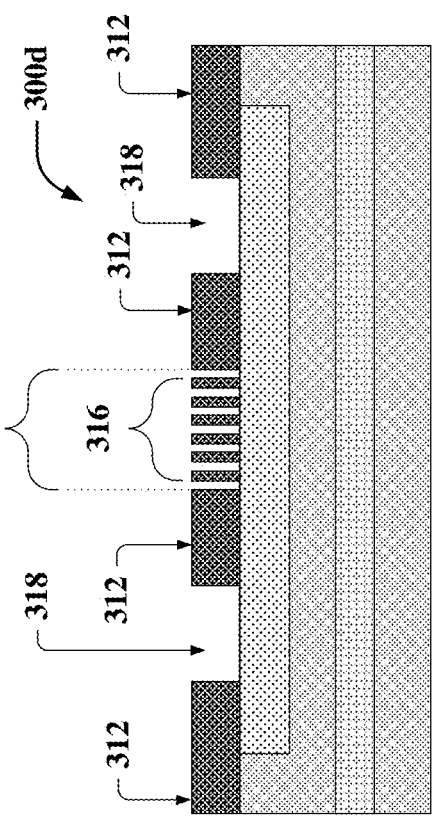
Figure 3C:
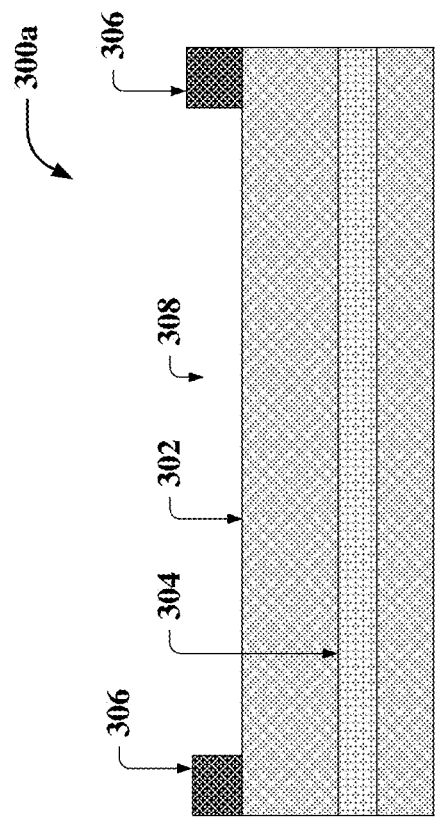

According to multiple embodiments, device 300b (FIG. 3B) can comprise an alternative embodiment of device 300a after formation of a dopant layer 310 in doped substrate 302. For example, dopant layer 310 can be formed in an area of doped substrate 302 defied by patterned opening 308 of photoresist layer 306 (e.g., as illustrated in FIG. 3B). In some embodiments, dopant layer 310 can be formed in doped substrate 302 by implanting a doping agent into doped substrate 302 (e.g., via ion implantation, diffusion, etc.) and activating such doping agent (e.g., via annealing). In some embodiments, dopant layer 310 can be implanted into doped substrate 302 such that dopant layer 310 comprises a thickness (e.g., height) of approximately 1 μm or greater. In some embodiments, dopant layer 310 can comprise a doping agent including, but not limited to, a p-type doping agent, an n-type doping agent, boron (B), phosphorous (P), nitrogen (N), and/or another doping agent. In some embodiments, dopant layer 310 can comprise an electrically conductive doped layer constituting one or more doped contact pads and/or one or more doped wires (e.g., electrically conductive doped contact pads 326 and electrically conductive doped wires 328 described below with reference to FIGS. 3E, 3F, and 4G).

According to multiple embodiments, device 300c (FIG. 3C) can comprise an alternative embodiment of device 300b after removing photoresist layer 306 from horizontal top surfaces of doped substrate 302, while maintaining dopant layer 310. In these embodiments, such removal of photoresist layer 306 as described above can provide device 300c comprising physically exposed top horizontal surfaces of doped substrate 302 and/or dopant layer 310. In some embodiments, photoresist layer 306 can be removed from horizontal top surfaces of doped substrate 302 by employing one or more material removal processes described above (e.g., a lift-off process (e.g., washing out photoresist layer 306), RIE, dry etching, wet etching, ion beam etching, plasma etching, laser ablation, CMP, etc.).

According to multiple embodiments, device 300d (FIG. 3D) can comprise an alternative embodiment of device 300c after forming and patterning a photoresist layer 312 on physically exposed horizontal top surfaces of doped substrate 302 and dopant layer 310. In some embodiments, photoresist layer 312 can comprise the same photoresist as photoresist layer 306 described above (e.g., positive-tone photoresist, negative-tone photoresist, hybrid-tone photoresist, etc.). In some embodiments, photoresist layer 312 can be formed and patterned utilizing the same lithography techniques described above with reference to FIG. 1E to form and pattern photoresist layer 104 (e.g., forming photoresist layer 312 atop doped substrate 302 and dopant layer 310, exposing photoresist layer 312 to a desired pattern of radiation, and developing the exposed photoresist of photoresist layer 312 utilizing a conventional resist developer).

Figure 3D:
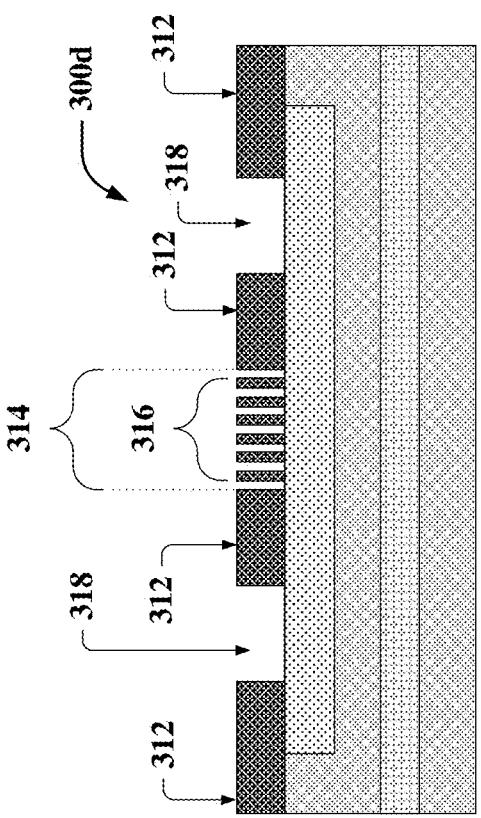
Figure 3F:
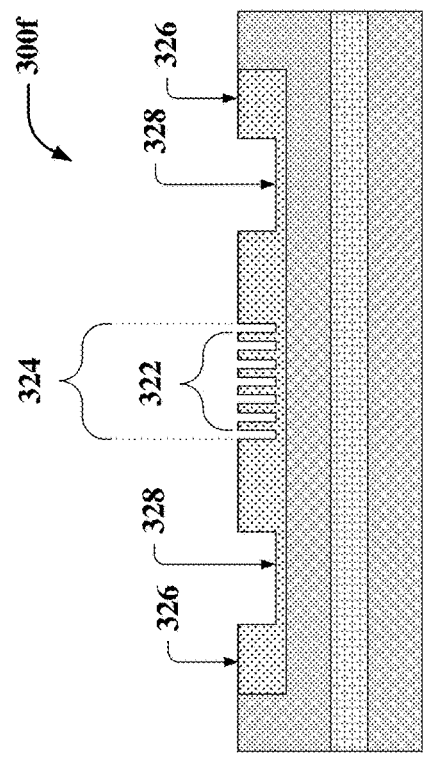

In some embodiments, photoresist layer 312 can be formed and patterned on the top surfaces of doped substrate 302 and dopant layer 310 such that photoresist layer 312 comprises a patterned fluidic channel 314, a patterned pillar array 316, and/or one or more patterned openings 318. In some embodiments, photoresist layer 312 can be formed and patterned on the top surface of dopant layer 310 such that patterned pillar array 316 is located inside patterned fluidic channel 314 (e.g., as depicted in FIG. 3D). In some embodiments, photoresist layer 312 can be formed and patterned on the top surface of dopant layer 310 such that patterned pillar array 316 comprises pillar components (e.g., electrically conductive doped pillars 320 described below with reference to FIG. 3E) that comprise a substantially cylindrical shape, pyramidic shape, and/or another shape. In some embodiments, photoresist layer 312 can be formed and patterned on the top surface of dopant layer 310 such that patterned pillar array 316 comprises pillar components (e.g., electrically conductive doped pillars 320 described below with reference to FIG. 3E) that are arranged with a translational offset in an asymmetric array (e.g., as illustrated by electrically conductive doped pillar array 322 depicted in FIG. 7C). In these embodiments, such an asymmetric array of pillar components can facilitate lateral displacement of particles in a fluid (e.g., colloid material).

Figure 3E:
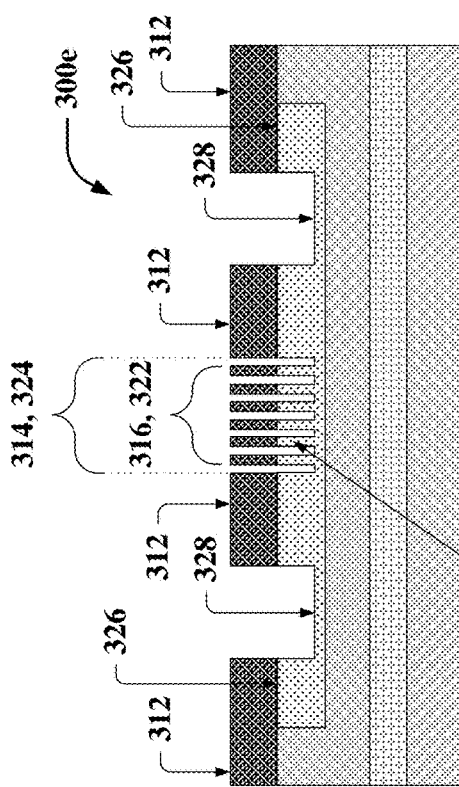
Figure 3G:
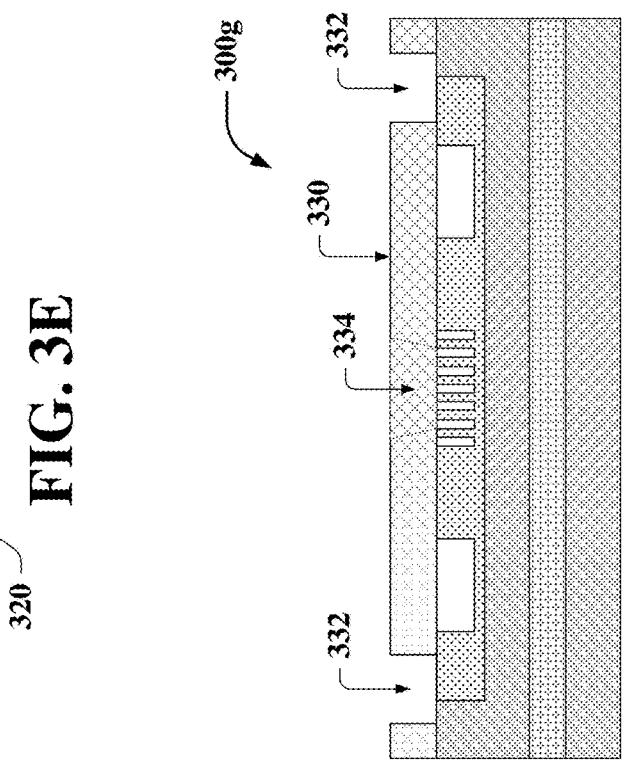

According to multiple embodiments, device 300e (FIG. 3E) can comprise an alternative embodiment of device 300d after removing portions of dopant layer 310 (e.g., as illustrated in FIG. 3E) to form one or more electrically conductive doped pillars 320, an electrically conductive doped pillar array 322, a fluidic channel 324, one or more electrically conductive doped contact pads 326, and/or one or more electrically conductive doped wires 328. In such embodiments, electrically conductive doped pillars 320 and/or electrically conductive doped pillar array 322 can be located inside (e.g., formed inside) fluidic channel 324 (e.g., as illustrated in FIG. 3E). In these embodiments, such portions of dopant layer 310 can be removed by employing one or more etching processes (e.g., RIE, dry etching, wet etching, ion beam etching, plasma etching, laser ablation, etc.). In some embodiments, electrically conductive doped contact pads 326 and/or electrically conductive doped wires 328 can constitute electrodes that can facilitate electrically coupling electrically conductive doped pillars 320 and/or electrically conductive doped pillar array 322 to an electrical power source (e.g., a voltage and/or current source as described below with reference to FIGS. 6A, 6B, and 6D).

According to multiple embodiments, device 300f (FIG. 3F) can comprise an alternative embodiment of device 300e after removing photoresist layer 312 from horizontal top surfaces of dopant layer 310, electrically conductive doped pillars 320, electrically conductive doped pillar array 322, and/or electrically conductive doped contact pads 326. In some embodiments, such removal of photoresist layer 312 as described above can be performed utilizing one or more material removal processes (e.g., a lift-off process (e.g., washing out photoresist layer 312), RIE, dry etching, wet etching, ion beam etching, plasma etching, laser ablation, CMP, etc.). In some embodiments, such removal of photoresist layer 312 as described above can provide device 300f comprising physically exposed top horizontal surfaces of dopant layer 310, electrically conductive doped pillars 320, electrically conductive doped pillar array 322, and/or electrically conductive doped contact pads 326.

In some embodiments, a thin oxide layer (e.g., thin oxide layer 502 depicted in FIGS. 5B, 5D, and 5E) can be deposited on physically exposed surfaces of electrically conductive doped pillars 320 utilizing ALD to coat electrically conductive doped pillars 320. In these embodiments, such a thin oxide layer (e.g., thin oxide layer 502) can provide a surface on which to form a strong bond with an encapsulation layer that can seal fluidic channel 324 and/or device 300f (e.g., encapsulation layer 330 described below with reference to FIG. 3G). In these embodiments, such a thin oxide layer (e.g., thin oxide layer 502) can serve as an electrical insulating layer to prevent a short circuit between electrically conductive doped pillars 320 and an electrically conductive encapsulation layer and/or encapsulation component that can be bonded to device 300f (e.g., encapsulation component 512 described below with reference to FIG. 5D).

According to multiple embodiments, device 300g (FIG. 3G) can comprise an alternative embodiment of device 300f after formation of an encapsulation layer 330 on physically exposed horizontal top surfaces of dopant layer 310, electrically conductive doped pillars 320, electrically conductive doped pillar array 322, and/or electrically conductive doped contact pads 326. In some embodiments, encapsulation layer 330 can comprise an encapsulation component (e.g., encapsulation components 508, 512 depicted in FIGS. 5C and 5D, respectively) that can comprise multiple encapsulation layers that can seal fluidic channel 324 and/or device 300f (or alternative embodiments thereof as described below with reference to FIGS. 5B, 5C, 5D, and 5E). In some embodiments, encapsulation layer 330 can comprise a coverslip (e.g., glass, doped borosilicate, etc.) that can be positioned on physically exposed horizontal top surfaces of device 300f (e.g., physically exposed horizontal top surfaces of dopant layer 310, electrically conductive doped pillars 320, electrically conductive doped pillar array 322, and/or electrically conductive doped contact pads 326). In some embodiments, encapsulation layer 330 can be bonded to such surfaces of device 300f (e.g., surfaces of dopant layer 310, electrically conductive doped pillars 320, electrically conductive doped pillar array 322, and/or electrically conductive doped contact pads 326) by employing thermal compressive bonding, anodic bonding, and/or another bonding technique. In some embodiments, encapsulation layer 330 can comprise a thickness (e.g., height) ranging from 1 µm-1000 µm.

In some embodiments, encapsulation layer 330 can comprise one or more cut-outs 332 that can be aligned over electrically conductive doped contact pads 326 to provide direct access to electrically wire device 300g to an electrical power source (e.g., a voltage and/or current source as described below with reference to FIGS. 6A, 6B, and 6D). In some embodiments, encapsulation layer 330 can comprise one or more ports 334 that can be aligned over fluidic channel 324 to provide connection to fluidic channel 324 (e.g., electrical connection and/or fluidic connection as depicted in FIGS. 6A and 6C). In some embodiments, ports 334 can facilitate inputting (e.g., introducing) and outputting (e.g., removing) fluid through device 300g, where such fluid can flow through device 300g via fluidic channel 124 and/or electrically conductive doped pillar array 322. In some embodiments, such fluid can comprise a solvent, a colloid, and/or another type of fluid comprising particles that can be separated from the fluid via electrically conductive doped pillars 320 and/or electrically conductive doped pillar array 322.

FIGS. 4A, 4B, 4C, 4D, 4E, 4F, and 4G illustrate top views of example, non-limiting devices 400a-400g that can facilitate electrically conductive deterministic lateral displacement (DLD) pillar array components in accordance with one or more embodiments described herein. Repetitive description of like elements and/or processes employed in various embodiments described herein is omitted for sake of brevity.

According to multiple embodiments, FIGS. 4A, 4B, 4C, 4D, 4E, 4F, and 4G can comprise top views of the example, non-limiting devices 300a-300g described above with reference to FIGS. 3A, 3B, 3C, 3D, 3E, 3F, and 3G. For example, devices 400a, 400b, 400c, 400d, 400e, 400f, 400g can comprise the example, non-limiting devices 300a, 300b, 300c, 300d, 300e, 300f, 300g, respectively. In FIG. 4G, dashed line 402 indicates where the cross-sectional side view of device 300g occurs relative to device 400g. In FIGS. 4A, 4B, 4C, 4D, 4E, and 4F, dashed line 402 is omitted for purposes of clarity.

In some embodiments, devices 400a-400g can comprise a footprint area (e.g., width×length) ranging from, for example, approximately 10 millimeters (mm)×10 mm to approximately 30 mm×26 mm. In some embodiments, electrically conductive doped contact pads 326 can comprise a footprint area that can facilitate electrical contact such as, for example, a footprint area ranging from approximately 1 mm×1 mm to approximately 5 mm×5 mm. In some embodiments, electrically conductive doped wires 328 can comprise a width that can facilitate minimum electrical resistance drop such as, for example, a width ranging from approximately 10 µm to approximately 100 µm. In some embodiments, electrically conductive doped pillars 320 can comprise a diameter ranging from, for example, approximately 0.05 µm to approximately 1.0 µm. In some embodiments, fluidic channel 324 and/or electrically conductive doped pillar array 322 can comprise a width that can range from, for example, approximately 20 µm to approximately 500 µm. In some embodiments, fluidic channel 324 and/or electrically conductive doped pillar array 322 can comprise a depth that can range from, for example, approximately 0.1 µm to approximately 1.0 µm. In some embodiments, electrically conductive doped pillar array 322 can comprise a length that can range from, for example, approximately 5 times (5×) to approximately 20 times (20×) the width of fluidic channel 324 and/or electrically conductive doped pillar array 322. In some embodiments, fluidic channel 324 can comprise any length that can limit hydrodynamic resistance. In some embodiments, the distance between input port 334a and output port 334b can range from, for example, approximately 2 mm to approximately 10 mm.

FIGS. 5A, 5B, 5C, 5D, and 5E illustrate cross-sectional side views of example, non-limiting devices 500a-500e that can facilitate electrically conductive deterministic lateral displacement (DLD) pillar array components in accordance with one or more embodiments described herein. Repetitive description of like elements and/or processes employed in various embodiments described herein is omitted for sake of brevity.

According to multiple embodiments, device 500a (FIG. 5A) can comprise electrically conductive pillar array 142 described above with reference to FIGS. 1A, 1B, 1C, 1D, 1E, 1F, 1G, 1H, 1I, and 1J. For example, device 500a can comprise electrically conductive pillars 140 (e.g., pillars 126 having thin metal layer 138 formed thereon) and encapsulation layer 144, where encapsulation layer 144 is bonded to electrically conductive pillar array 142.

According to multiple embodiments, device 500b (FIG. 5B) can comprise an alternative, non-limiting example embodiment of device 500a, where device 500b can comprise a thin oxide layer 502 formed on thin metal layer 138 and encapsulation layer 504 in place of encapsulation layer 144. In some embodiments, as described above with reference to FIG. 1I, thin oxide layer 502 can be deposited (e.g., via ALD) on thin metal layer 138 formed on electrically conductive pillars 140. In these embodiments, thin oxide layer 502 can provide a surface on which to form a strong bond with encapsulation layer 504 that can seal fluidic channel 130. In these embodiments, thin oxide layer 502 can serve as an electrical insulating layer to prevent a short circuit between electrically conductive pillars 140 and encapsulation layer 504 and/or encapsulation component (e.g., encapsulation component 512 described below with reference to FIG. 5D). In some embodiments, thin oxide layer 502 can comprise the same material that can be used to form oxide layer 114 described above with reference to FIG. 1D. In some embodiments, thin oxide layer 502 can comprise a thickness (e.g., height) ranging from 0.001 µm-10 µm.

In some embodiments, encapsulation layer 504 can comprise a conductive oxide material such as, for example, indium tin oxide and/or another conductive oxide material. In some embodiments, encapsulation layer 504 can comprise a coverslip that can be bonded to horizontal top surfaces of thin oxide layer 502 by employing thermal compressive bonding, anodic bonding, adhesion promoter chemical bonding, and/or another bonding technique. In some embodiments, encapsulation layer 504 can provide a leak proof seal of fluidic channel 130, as well as a conductive plate to complete a capacitor with electrically conductive pillars 140 (e.g., as described below with reference to FIG. 6D). In some embodiments, encapsulation layer 504 can comprise a thickness (e.g., height) ranging from 1-μm-1000 μm.

According to multiple embodiments, device 500c (FIG. 5C) can comprise an alternative, non-limiting example embodiment of device 500a, where device 500c can comprise an encapsulation component 508 in place of encapsulation layer 144. In some embodiments, encapsulation component 508 can comprise encapsulation layer 504 and/or an encapsulation layer 506. In some embodiments, encapsulation layer 506 can comprise a coverslip that can be bonded to horizontal top surfaces of thin metal layer 138 by employing thermal compressive bonding, eutectic bonding, adhesion promoter chemical bonding, and/or another bonding technique. In some embodiments, encapsulation layer 504 can be a coverslip that can be bonded to the horizontal top surface of encapsulation layer 506 by employing thermal compressive bonding, anodic bonding, and/or another bonding technique. In some embodiments, encapsulation layer 506 can comprise a dielectric material such as, for example, a non-conductive oxide (e.g., silicon oxide, aluminum oxide, etc.) and/or another dielectric material. In some embodiments, encapsulation layer 506 can provide a leak proof seal of fluidic channel 130. In some embodiments, encapsulation layer 506 can serve as an electrical insulating layer to prevent a short circuit between electrically conductive pillars 140 and encapsulation layer 504. In some embodiments, encapsulation layer 506 can comprise a thickness (e.g., height) ranging from 0.1 μm-100 μm.

According to multiple embodiments, device 500d (FIG. 5D) can comprise an alternative, non-limiting example embodiment of device 500b, where device 500d can comprise an encapsulation component 512 in place of encapsulation layer 504. In some embodiments, encapsulation component 512 can comprise encapsulation layer 506 and/or an encapsulation layer 510. In some embodiments, encapsulation layer 510 can comprise a coverslip that can be bonded to the horizontal top surface of encapsulation layer 506 by employing thermal compressive bonding, eutectic bonding, adhesion promoter chemical bonding, and/or another bonding technique. In some embodiments, encapsulation layer 510 can comprise a metal overlayer comprising metallic material including, but not limited to, nickel (Ni), cobalt (Co), molybdenum (Mo), tantalum (Ta), platinum (Pt), tungsten (W), titanium nitride (TiN), palladium (Pd), gold (Au), silver (Ag), copper (Cu), and/or another metallic material. In some embodiments, encapsulation layer 510 can comprise a thickness (e.g., height) ranging from 0.1 μm-100 μm.

According to multiple embodiments, device 500e (FIG. 5E) can comprise an alternative, non-limiting example embodiment of device 500d, where device 500e can comprise encapsulation component 508 in place of encapsulation component 512. In some embodiments, as described above with reference to FIG. 5C, encapsulation component 508 can comprise encapsulation layer 504 and/or encapsulation layer 506. In some embodiments, encapsulation layer 506 can comprise a coverslip that can be bonded to horizontal top surfaces of thin oxide layer 502 by employing thermal compressive bonding, anodic bonding, and/or another bonding technique. In some embodiments, as described above with reference to FIG. 5C, encapsulation layer 504 can comprise a coverslip that can be bonded to the horizontal top surface of encapsulation layer 506 by employing thermal compressive bonding, anodic bonding, adhesion promoter chemical bonding, and/or another bonding technique.

Although encapsulation layers 504, 506, 510 are described above as being implemented with electrically conductive pillar array 142, device 100j, and/or device 200j, it should be appreciated that the various embodiments of the subject disclosure are not so limited. For example, encapsulation layers 504, 506, 510 can also be implemented with electrically conductive doped pillar array 322, device 300g, and/or device 400g by altering any materials and/or bonding processes described above in FIGS. 5A and 5B as needed to facilitate such implementation with electrically conductive doped pillar array 322, device 300g, and/or device 400g.

Figure 6B:
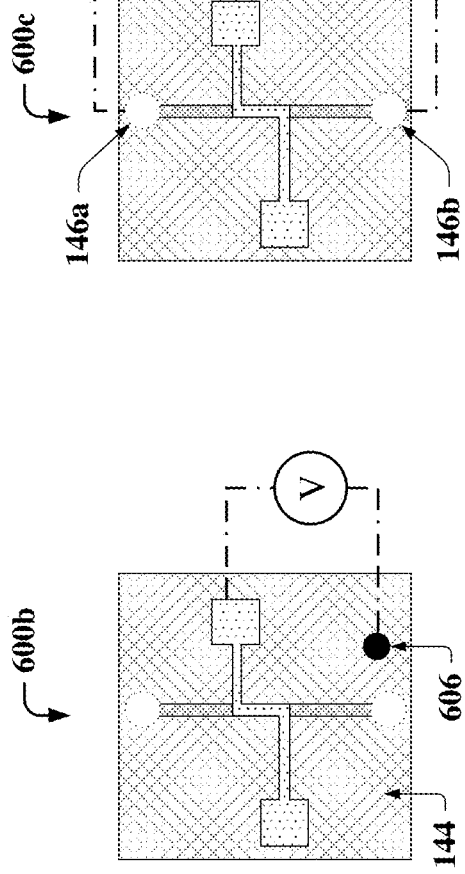
Figure 6A:
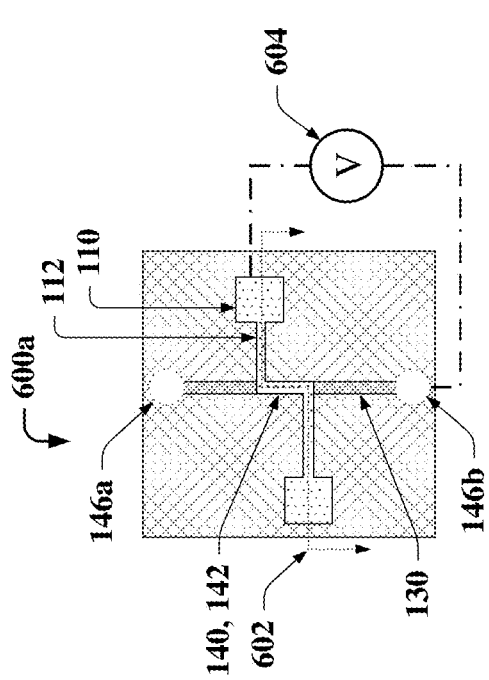

FIGS. 6A, 6B, and 6C illustrate top views of example, non-limiting devices 600a-600c that can facilitate electrically conductive deterministic lateral displacement (DLD) pillar array components in accordance with one or more embodiments described herein. Repetitive description of like elements and/or processes employed in various embodiments described herein is omitted for sake of brevity.

In some embodiments, to facilitate operation of electrically conductive pillar array 142 (and/or electrically conductive doped pillar array 322) an electrical circuit can be formed in which electrically conductive pillar array 142 (and/or electrically conductive doped pillar array 322) can serve as a first of two plates of a capacitor within device 600a. In such embodiments, a second plate of such capacitor can be selected based on the needs of a system in which electrically conductive pillar array 142 and/or device 600a can be implemented (e.g., a deterministic lateral displacement (DLD) array periodic fluidic ratchet device) and/or application thereof. According to multiple embodiments, devices 600a-600c can constitute example, non-limiting embodiments of the subject disclosure comprising example, non-limiting wiring configurations (e.g., electrical circuits forming a capacitor) that can facilitate operation of electrically conductive pillar array 142 in accordance with one or more embodiments described herein. In FIG. 6A, dashed line 602 indicates where the cross-sectional side view of device 100j occurs relative to device 600a. In FIGS. 6B and 6C, dashed line 602 is omitted for purposes of clarity.

According to multiple embodiments, device 600a (FIG. 6A) can comprise an alternative, non-limiting example embodiment of device 100j and/or device 200j, where device 600a can comprise a voltage source 604 (e.g., an alternating current (AC) or a direct current (DC) electrical power source) that can be coupled (e.g., electrically) to metal contact pad 110 and an electrode (not illustrated in FIG. 6A) that can be located inside fluidic channel 130 and/or output port 146b. In such embodiments, electrically conductive pillar array 142 (e.g., via metal contact pads 110 and/or metal wires 112) can serve as the first of two plates of a capacitor within device 600a. In such embodiments, the electrode described above (not illustrated in FIG. 6A) that can be located inside fluidic channel 130 and/or output port 146b can serve as the second plate of a capacitor. In these embodiments, by applying a voltage to device 600a (e.g., via voltage source 604), a floating potential (e.g., electropotential) can be generated between a fluid flowing through device 600a and electrically conductive pillars 140 of electrically conductive pillar array 142. In these embodiments, by applying voltage to device 600a (e.g., via voltage source 604), an electric field such as, for example, a Debye layer, an ionic layer, and/or another electric field can be generated across electrically conductive pillars 140 of electrically conductive pillar array 142.

According to multiple embodiments, device 600b (FIG. 6B) can comprise an alternative, non-limiting example embodiment of device 600a, where device 600b can comprise voltage source 604 coupled (e.g., electrically) to metal contact pad 110 and an electrode 606 formed on a surface of (and/or inside) encapsulation layer 144. In such embodiments, electrically conductive pillar array 142 (e.g., via metal contact pads 110 and/or metal wires 112) can serve as the first of two plates of a capacitor within device 600b. In such embodiments, electrode 606 and/or encapsulation layer 144 can serve as the second plate of a capacitor. In these embodiments, by applying a voltage to device 600b (e.g., via voltage source 604), an electropotential can be generated between electrode 606 (e.g., the top surface of encapsulation layer 144) and electrically conductive pillars 140 of electrically conductive pillar array 142. In these embodiments, by applying voltage to device 600b (e.g., via voltage source 604), an electric field such as, for example, a Debye layer, an ionic layer, and/or another electric field can be generated across electrically conductive pillars 140 of electrically conductive pillar array 142.

According to multiple embodiments, device 600c (FIG. 6C) can comprise an alternative, non-limiting example embodiment of device 600a, where device 600c can comprise voltage source 604 coupled (e.g., electrically) to a first electrode (not illustrated in FIG. 6C) that can be located inside fluidic channel 130 and/or input port 146a and a second electrode (not illustrated in FIG. 6C) that can be located inside fluidic channel 130 and/or output port 146b. In these embodiments, the first of such two electrodes can serve as the first of two plates of a capacitor within device 600c and the second electrode can serve as the second plate of such a capacitor. In these embodiments, by applying a voltage to device 600c (e.g., via voltage source 604), an electrophoretic electropotential can be generated across electrically conductive pillars 140 of electrically conductive pillar array 142, running between input port 146a and output port 146b of fluidic channel 130. In such embodiments, electrically conductive pillars 140 and/or electrically conductive pillar array 142 can act as a polarizable membrane that can attenuate and/or alter an electric field and/or ion flux (e.g., a Debye layer, an ionic layer, etc.) across electrically conductive pillar array 142 based on the applied potential.

Figure 6D:
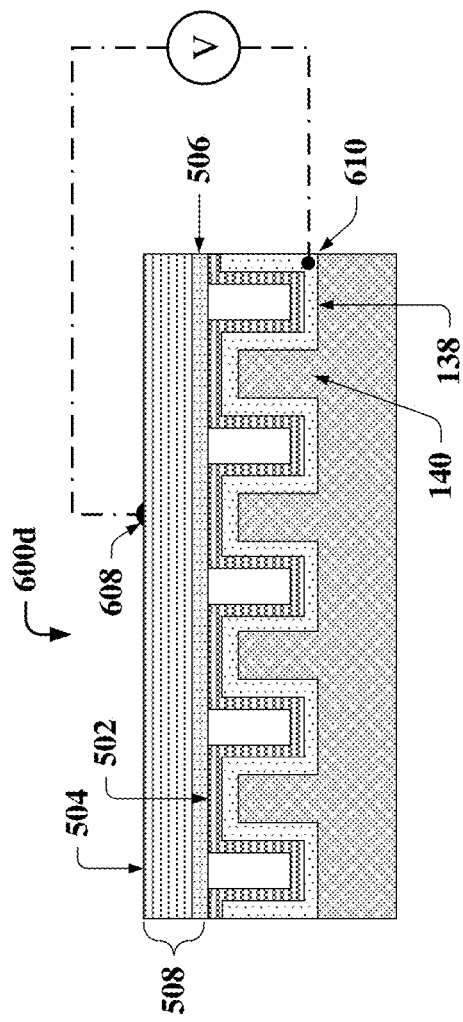
FIG. 6D illustrates a cross-sectional side view of an example, non-limiting device that can facilitate electrically conductive deterministic lateral displacement (DLD) pillar array components in accordance with one or more embodiments described herein.

FIG. 6D illustrates a cross-sectional side view of an example, non-limiting device 600d that can facilitate electrically conductive deterministic lateral displacement (DLD) pillar array components in accordance with one or more embodiments described herein. Repetitive description of like elements and/or processes employed in various embodiments described herein is omitted for sake of brevity.

According to multiple embodiments, device 600d (FIG. 6D) can comprise an alternative, non-limiting example embodiment of device 500e, where device 600d can comprise voltage source 604 coupled (e.g., electrically) to an electrode 608 formed on a surface of (and/or inside) encapsulation layer 504 and an electrode 610 formed on a surface of (and/or inside) thin metal layer 138 of electrically conductive pillars 140. In such embodiments, electrically conductive pillar array 142 (e.g., via electrode 610 and/or electrically conductive pillars 140) can serve as the first of two plates of a capacitor within device 600d. In such embodiments, electrode 608 and/or encapsulation layer 504 can serve as the second plate of a capacitor. In these embodiments, by applying a voltage to device 600d (e.g., via voltage source 604), an electropotential can be generated between electrode 608 (e.g., the top surface of encapsulation layer 504) and electrically conductive pillars 140 of electrically conductive pillar array 142 (e.g., via electrode 610). In these embodiments, by applying voltage to device 600d (e.g., via voltage source 604), an electric field such as, for example, a Debye layer, an ionic layer, and/or another electric field can be generated across electrically conductive pillars 140 of electrically conductive pillar array 142.

Although the various wiring configurations described above with reference to FIGS. 6A, 6B, 6C, and 6D are described as being implemented with electrically conductive pillar array 142, device 100j, and/or device 200j, it should be appreciated that the various embodiments of the subject disclosure are not so limited. For example, such wiring configurations can also be implemented with electrically conductive doped pillar array 322, device 300g, and/or device 400g by altering such wiring configurations as needed to facilitate such implementation with electrically conductive doped pillar array 322, device 300g, and/or device 400g.

FIGS. 7A, 7B, and 7C illustrate top views of example, non-limiting devices 700a-700c that can facilitate electrically conductive deterministic lateral displacement (DLD) pillar array components in accordance with one or more embodiments described herein. FIG. 7D illustrates an orthogonal cutaway view of an example, non-limiting device 700d that can facilitate electrically conductive deterministic lateral displacement (DLD) pillar array components in accordance with one or more embodiments described herein. Repetitive description of like elements and/or processes employed in various embodiments described herein is omitted for sake of brevity.

In some embodiments, device 700a (FIG. 7A) can comprise device 100j (FIG. 1J) and/or device 200j (FIG. 2J), where device 700a can comprise input port 146a, fluidic channel 130, device 700b, device 700c, device 700d, metal contact pads 110, metal wires 112, outlet port 146b, and/or encapsulation layer 144. In some embodiments, device 700b (FIG. 7B) can comprise an inset view of device 700a, where device 700b can comprise one or more filters and/or anti-clogging structures 702 (e.g., serpentine cross flow filter, serpentine pillar filter, etc.), an open mesochannel 704, overlap sections 124a, 124b, electrically conductive pillar array 142, device 700c, and/or device 700d. In some embodiments, device 700c (FIG. 7C) can comprise an inset view of device 700b, where device 700c can comprise electrically conductive pillar array 142, which can comprise axial pitch 706, lateral pitch 708, gap 710, row-shift 712, and/or device 700d. In some embodiments, device 700d (FIG. 7D) can comprise an inset view of device 700c, where device 700d can comprise electrically conductive pillar 140, which can comprise pillar 126, thin metal layer 138, and/or thin oxide layer 502.

FIG. 7A illustrates a basic structural layout of a single input (e.g., input port 146a), single output (e.g., output port 146b) device 700a (e.g., device 100i or device 300g) which can be a nanoDLD device in accordance with one or more embodiments described herein. In some embodiments, device 700a can comprise a single microfluidic channel (e.g., fluidic channel 130), in which a nanoDLD pillar array (e.g., electrically conductive pillar array 142) can be embedded. In some embodiments, a single through-silicon via (e.g., a TSV constituting input port 146a) can allow fluid injection (e.g., single input), which can flow through the nanoDLD array (e.g., through electrically conductive pillar array 142 via fluidic channel 130) and exit a single TSV outlet (e.g., output port 146b). In some embodiments, device 700a can be a full-width injection type structure that can facilitate introducing sample particle fluid into the nanoDLD (e.g., into electrically conductive pillar array 142). In some embodiments, sample fluid can be injected from the backside of device 700a (e.g., through substrate 102 as illustrated by port 146 in FIG. 1J). Additionally or alternatively, in some embodiments, a glass coverslip (e.g., encapsulation layer 144) can be prepared with holes (e.g., cut-outs described above in FIG. 1J) that set over the TSV region, allowing front-side fluidic injection.

In some embodiments, contact pads and wires (e.g., metal contact pads 110 and metal wires 112), share a metal layer overlap (e.g., at overlap sections 124a, 124b via thin metal layer 138) with the nanoDLD array (e.g., electrically conductive pillar array 142) that can be embedded in the microfluidic channel (e.g., fluidic channel 130). In some embodiments, such overlap can be formed from the metal layer used to form the contact pads and wires (e.g., metal layer 108 used to form metal contact pads 110 and metal wires 112) and the metal layer (e.g., thin metal layer 138) used to coat the silicon pillars (e.g., pillars 126). In some embodiments, the layer of metal (e.g., metal layer 108 and/or thin metal layer 138) can form the electrical contact that enables operation of device 700a. In FIG. 7B, the overlap (e.g., overlap sections 124a, 124b) is depicted as being formed within the microchannel region (e.g., within fluidic channel 130 to facilitate an in-channel connection). Additionally or alternatively, in some embodiments, the overlap can be offset into the wall (e.g., via side wire connection 808 having overlap sections 124a, 124b depicted in FIG. 8B as a side connection). In some embodiments, the metal contact pads (e.g., metal contact pads 110) sit in windows formed from the open holes (e.g., cut-outs described above in FIG. 1J) in the coverslip (e.g., encapsulation layer 144) and oxide layer (e.g., oxide layer 114), thereby providing direct access for wiring device 700a via the front-side. In FIG. 7A, two separate contact pads (e.g., metal contact pads 110) are depicted, allowing a closed circuit to be made across the arrays (e.g., electrically conductive pillar array 142). Additionally or alternatively, in some embodiments, only a single contact pad (e.g., metal contact pad 110) can be fabricated, thereby facilitating only capacitive measurement of device 700a.

In some embodiments, the pillar array (e.g., electrically conductive pillar array 142) can be nested inside the microchannel (e.g., fluidic channel 130). In some embodiments, upstream of the pillar array (e.g., electrically conductive pillar array 142) can be placed filters and/or anti-clogging structure (e.g., serpentine cross flow filter, serpentine pillar filter, etc.). In some embodiments, the pillar array (e.g., electrically conductive pillar array 142) can be fabricated according to standard nanoDLD geometry constrains, where such geometric constraints of electrically conductive pillar array 142 (e.g., axial pitch 706, lateral pitch 708, gap 710, row-shift 712, etc.) can define the separation capability of the array. In these embodiments, such parameters can be set by the silicon lithography (e.g., via the example, non-limiting multi-step fabrication sequence described above with reference to FIGS. 1A, 1B, 1C, 1D, 1E, 1F, 1G, 1H, 1I, and 1J). In some embodiments, only the gap size (e.g., gap 710) is affected directly by the metal coating (e.g., thin metal layer 138). In some embodiments, the silicon gap size (e.g., gap size between pillars 126) can be determined such that once the metal layer (e.g., thin metal layer 138) is deposited, the desired final gap size is achieved (e.g., gap 710). In FIG. 7C, the gap (e.g., gap 710) is depicted with a row-shift fraction of N=5, angled to the right-hand wall of the microchannel (e.g., fluidic channel 130). In some embodiments, for example, as depicted in FIG. 7D, each pillar (e.g., electrically conductive pillars 140) can comprise the core silicon structure (e.g., pillar 126) on top of which can be deposited the conductive layer (e.g. thin metal layer 138) and an optional oxide layer (e.g., thin oxide layer 502) to assist in bonding the pillar arrays (e.g., electrically conductive pillar array 142) to the glass coverslip (e.g., encapsulation layer 144). In some embodiments, gap 710 can comprise a distance ranging from, for example, approximately 0.01 μm to approximately 1.0 μm.

FIGS. 8A, 8B, and 8C illustrate top views of example, non-limiting devices 800a-800c that can facilitate electrically conductive deterministic lateral displacement (DLD) pillar array components in accordance with one or more embodiments described herein. Repetitive description of like elements and/or processes employed in various embodiments described herein is omitted for sake of brevity.

In some embodiments, device 800a (FIG. 8A) can comprise an alternative, non-limiting example embodiment of device 100j (FIG. 1J), device 200j (FIG. 2J), and/or device 700a (FIG. 7A), where device 800a can comprise a sample inlet 146c, a buffer inlet 146d, one or more inlet microchannels 130a, 130b, device 800b, device 800c, metal contact pads 110, metal wires 112, one or more outlet microchannels 130c, 130d, an unsorted outlet 146e, and/or a sorted outlet 146f. In some embodiments, device 800b (FIG. 8B) can comprise an inset view of device 800a, where device 800b can comprise a sample inlet channel 802, a buffer inlet channel 804, a focusing junction mesochannel 806, filters and/or anti-clogging structures 702, a side wire connection 808 comprising overlap sections 124a, 124b, and/or electrically conductive pillar array 142. In some embodiments, device 800c (FIG. 8C) can comprise another inset view of device 800a, where device 800c can comprise electrically conductive pillar array 142, a splitting junction 810, an in-channel wire connection 812 comprising overlap sections 124a, 124b, an unsorted outlet channel 814, and/or a sorted outlet channel 816.

FIG. 8A illustrates a basic structural layout of a two input (e.g., sample inlet 146c and buffer inlet 146d), two output (e.g., unsorted outlet 146e and sorted outlet 146f) nanoDLD device (e.g., device 800a comprising electrically conductive pillar array 142). In some embodiments, device 800a can facilitate separating particles (e.g., via electrically conductive pillar array 142) while simultaneously transferring them into a different solvent during operation (e.g., via splitting junction 810, unsorted outlet channel 814, and/or sorted outlet channel 816 illustrated in FIG. 8C), thereby enabling complete purification. In some embodiments, device 800a can comprise the same structural layout as the single input/output device described above (e.g., device 700a described above with reference to FIGS. 7A, 7B, 7C, and 7D). In some embodiments, device 800a can comprise two TSVs at the input (e.g., sample inlet 146c and buffer inlet 146d) that facilitate injecting both a sample fluid (e.g., a colloid) and a buffer (e.g., alternative solvent) simultaneously. In some embodiments, the two inlet microchannels (e.g., inlet microchannels 130a, 130b) from each TSV (e.g., sample inlet 146c and buffer inlet 146d) meet at focusing junction mesochannel 806 where the two fluids streamline into a single channel (e.g., as illustrated in FIG. 8B).

FIGS. 8B and 8C illustrate example, non-limiting embodiments of a side wall and in-line connected buried wire (e.g., side wire connection 808 and in-channel wire connection 812, respectively), making electrical connection (e.g., as depicted by overlap sections 124a, 124b) to the conductive nanoDLD pillar array (e.g., electrically conductive pillar array 142). In some embodiments, separated (e.g., sorted) particles can be collected on one side of the nanoDLD array (e.g., electrically conductive pillar array 142), for example, on the right-hand side as described above with reference to FIG. 7C. In some embodiments, unsorted and sorted particles in the fluid stream can enter splitting junction 810 downstream of the nanoDLD array (e.g., electrically conductive pillar array 142). In some embodiments, splitting junction 810 can separate the fluid stream into two separate microchannels (e.g., unsorted outlet channel 814 and sorted outlet channel 816), where they feed to the outlet TSVs (e.g., unsorted outlet 146e and sorted outlet 146b).

In some embodiments, to facilitate an electrical connection downstream of the nanoDLD (e.g., downstream of electrically conductive pillar array 142), at least one conductive overlap (e.g., in-channel wire connection 812 comprising overlap sections 124a, 124b) must be made with metal wires 112 (e.g., as depicted in FIG. 8C). FIG. 8C depicts such a conductive overlap on the sorted side of splitting junction 810, using in-channel wire connection 812. In some embodiments, it can be appreciated that additional inputs/outputs (e.g., additional sample inlets 146c, buffer inlets 146d, unsorted outlets 146e, and/or sorted outlets 146f) can be linked to the same array (e.g., electrically conductive pillar array 142), using multiples of the same structural elements described here. In some embodiments, it can be appreciated that only a single contact electrode (e.g., metal contact pad 110 and/or metal wire 112) can facilitate operation of device 800a in a capacitive manner Additionally, or alternatively, in some embodiments, multiple electrodes (e.g., metal contact pads 110 and/or metal wires 112) can be used to facilitate redundancy, in-circuit monitoring, and/or passing current across the pillars (e.g., electrically conductive pillars 140 of electrically conductive pillar array 142).

The various embodiments of the subject disclosure described herein (e.g., device 100j, device 300g, devices 500a-500d, devices 600a-600d, device 700a, device 800a, device 900a, device 1000a, and/or device 1000b) can comprise electrically conductive DLD pillar array devices, systems, and/or processes for fabricating the same that can be associated with various technologies. For example, the various embodiments of the subject disclosure described herein (e.g., device 100j, device 300g, devices 500a-500d, devices 600a-600d, device 700a, device 800a, device 900a, device 1000a, and/or device 1000b) can be associated with semiconductor device technologies, semiconductor device fabrication technologies, periodic fluidic ratchet device technologies, deterministic lateral displacement (DLD) array device technologies, directional mode locking array device technologies, asymmetric slit array device technologies, particle separation device technologies, nano-particle separation device technologies, electrically conducting particle separation device technologies, electrically conducting nano-particle separation device technologies, electrically conductive DLD array device technologies, and/or other technologies.

The various embodiments of the subject disclosure described herein (e.g., device 100j, device 300g, devices 500a-500d, devices 600a-600d, device 700a, device 800a, device 900a, device 1000a, and/or device 1000b) can provide technical improvements to devices, systems, components, operational steps, and/or processing steps associated with the various technologies listed above. For example, the pillar arrays of a periodic fluidic ratchet device such as, for example, a DLD array device can be fabricated to be conductive, thereby facilitating application of an electric potential to the arrays (e.g., electrically conductive pillar array 142). In some embodiments, such electrification of the array can facilitate generation of localized electric fields within the pillar feature gaps (e.g., gaps 710 between electrically conductive pillars 140 of electrically conductive pillar array 142 described above with reference to FIG. 7C), which can enable improved separation of particles in a fluid (e.g., electrically charged particles of a colloid fluid that have diameters of 20 nm or smaller). In some embodiments, application of an electric field (e.g., a Debye layer, an ionic layer, etc.) can be used to alter the size selection criterion of particles which are charged, thereby facilitating tuning of the selectivity, as well as a further reduction of the critical size of the array (e.g., electrically conductive pillar array 142). In some embodiments, application of an electropotential provides a second separation dimension for resolving particles of different electrical charges within the array (e.g., electrically conductive pillar array 142), thereby facilitating increased resolution capacity. In some embodiments, the conductive nature of the array (e.g., electrically conductive pillar array 142) can be used as a sensor to acquire local currents and/or potential differences. In some embodiments, conductive pillars (e.g., electrically conductive pillars 140 of electrically conductive pillar array 142) can facilitate electrochemical reactions to be initiated in the pillar arrays (e.g., electrically conductive pillar array 142), thereby enabling in situ chemical modification of particles as such particles transit the array, as well as coupling particle separation and reactivity within a single device.

The various embodiments of the subject disclosure described herein (e.g., device 100j, device 300g, devices 500a-500d, devices 600a-600d, device 700a, device 800a, device 900a, device 1000a, and/or device 1000b) can be coupled to hardware and/or software to solve problems that are highly technical in nature, that are not abstract and that cannot be performed as a set of mental acts by a human. For example, generating an electrical field across an electrically conductive nano-scale DLD pillar array device and/or separating nano-scale particles of a fluid (e.g., particles of a colloid that have diameters smaller than 20 nm) based on such electrical field are operations that are not abstract and that cannot be performed as a set of mental acts by a human.

The various embodiments of the subject disclosure described herein (e.g., device 100j, device 300g, devices 500a-500d, devices 600a-600d, device 700a, device 800a, device 900a, device 1000a, and/or device 1000b) can facilitate electrically conductive deterministic lateral displacement (DLD) pillar array components utilizing various combinations of electrical components, mechanical components, and circuitry that cannot be replicated in the mind of a human or performed by a human. For example, generating an electrical field across an electrically conductive nano-scale DLD pillar array device and/or separating nano-scale particles of a fluid (e.g., particles of a colloid that have diameters smaller than 20 nm) based on such electrical field are operations that are greater than the capability of a human mind.

The various embodiments of the subject disclosure described herein (e.g., device 100j, device 300g, devices 500a-500d, devices 600a-600d, device 700a, device 800a, device 900a, device 1000a, and/or device 1000b) can also be fully operational towards performing one or more other functions (e.g., fully powered on, fully executed, etc.) while also performing the above-referenced electrical field generation and/or particle separation. It should also be appreciated that such simultaneous multi-operational execution is beyond the capability of a human mind.

Figures 9A, 9B:
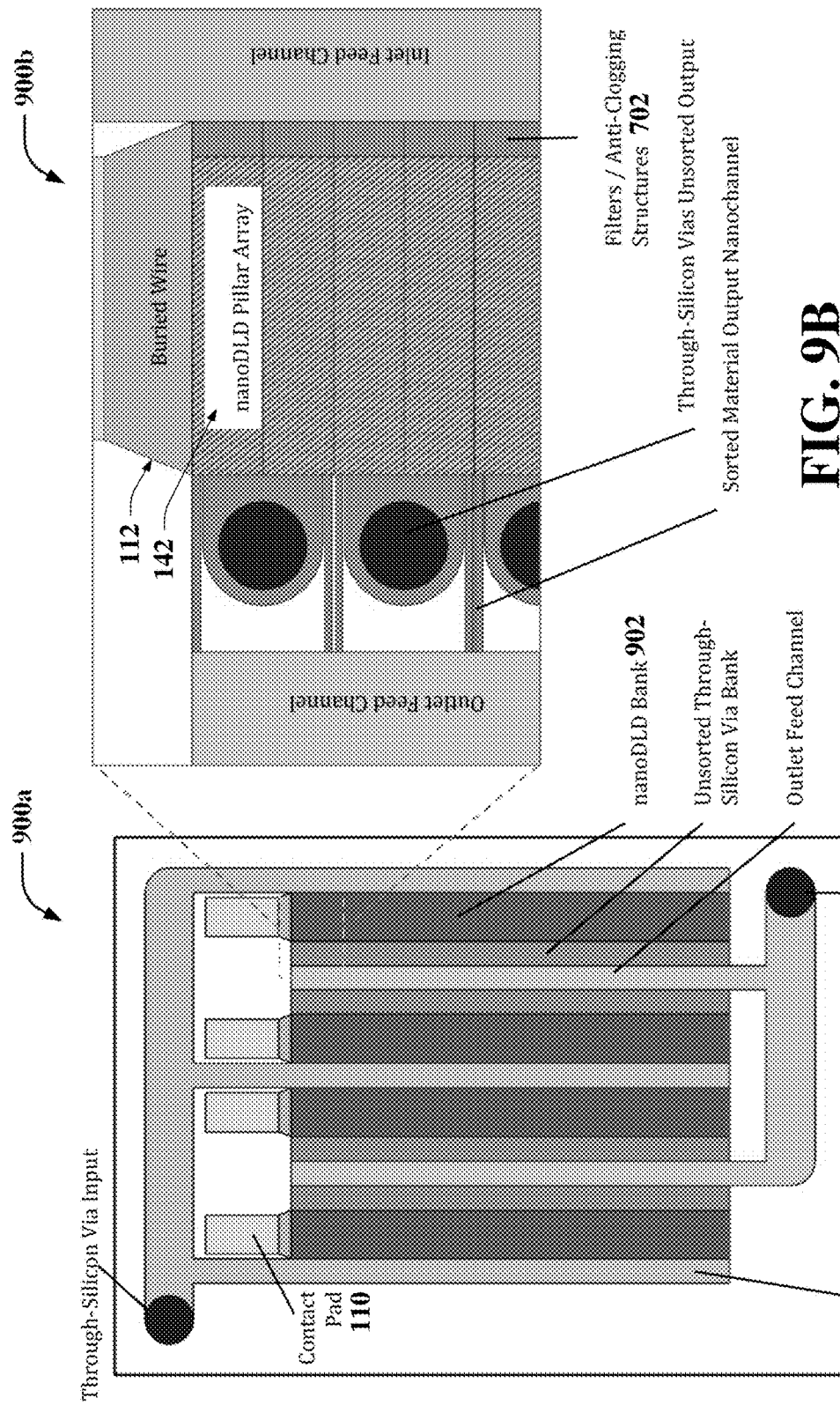
FIGS. 9A and 9B illustrate top views of example, non-limiting devices that can facilitate electrically conductive deterministic lateral displacement (DLD) pillar array components in accordance with one or more embodiments described herein.

FIGS. 9A and 9B illustrate top views of example, non-limiting devices 900a and 900b that can facilitate electrically conductive deterministic lateral displacement (DLD) pillar array components in accordance with one or more embodiments described herein. Repetitive description of like elements and/or processes employed in various embodiments described herein is omitted for sake of brevity.

In some embodiments, device 900a (FIG. 9A) can comprise an alternative, non-limiting example embodiment of device 100j (FIG. 1J), device 200j (FIG. 2J), device 700a (FIG. 7A), and/or device 800a (FIG. 8A), where device 900a can comprise a nanoDLD bank 902. In some embodiments, nanoDLD bank 902 can comprise multiple electrically conductive pillar arrays 142. In some embodiments, device 900b (FIG. 9B) can comprise an inset view of device 900a.

FIGS. 9A and 9B illustrate a basic structural layout of an integrated, parallel nanoDLD device using a single layer (e.g., silicon chip) model. In some embodiments, device 900a can comprise multiple nanoDLD arrays (e.g., a bank of electrically conductive pillar arrays 142) that can be plumbed together using a single busing system of microchannels. In some embodiments, device 900a can comprise a modified busing network in which space can be provided for metal contact pads 110 and metal wires 112 are buried to facilitate electrical connection to a battery of pillar arrays (e.g., a bank of electrically conductive pillar arrays 142). In some embodiments, a single common electrode (e.g., metal wire 112) can be used to wire all of the nanoDLD arrays (e.g., electrically conductive pillar arrays 142) in a single bank of devices. In some embodiments, individual contact pads (e.g., metal contact pads 110) of each bank can be wired independently or in common.

FIGS. 10A and 10B illustrate top views of example, non-limiting devices 1000a and 1000b that can facilitate electrically conductive deterministic lateral displacement (DLD) pillar array components in accordance with one or more embodiments described herein. FIG. 10C illustrates an orthogonal view of an example, non-limiting device 1000c that can facilitate electrically conductive deterministic lateral displacement (DLD) pillar array components in accordance with one or more embodiments described herein. Repetitive description of like elements and/or processes employed in various embodiments described herein is omitted for sake of brevity.

In some embodiments, device 1000a (FIG. 10A) can comprise an alternative, non-limiting example embodiment of device 100j (FIG. 1J), device 200j (FIG. 2J), device 700a (FIG. 7A), device 800a (FIG. 8A), and/or device 900a (FIG. 9A). In some embodiments, device 1000b (FIG. 10B) can comprise an alternative, non-limiting example embodiment of device 100j (FIG. 1J), device 200j (FIG. 2J), device 700a (FIG. 7A), device 800a (FIG. 8A), device 900a (FIG. 9A), and/or device 1000a (FIG. 10A). In some embodiments, device 1000c (FIG. 10C) can comprise an inset view of device 1000a and device 1000b.

FIGS. 10A and 10B illustrate two example, non-limiting embodiments of the subject disclosure, in which the fluidics can be fabricated over the buried conductive layer (e.g., metal wires 112). In some embodiments, the oxide layer (e.g., oxide layer 114) used to bury the wiring (e.g., metal wires 112) can comprise a thickness (e.g., approximately 5 µm to approximately 20 µm) that can facilitate low resistance microfluidic channels to be fabricated. In some embodiments, a single common ground (e.g., via metal contact pad 110) can be directly integrated into device 1000a to enable a capacitor type connection. In some embodiments, a double contact system, for example, as illustrated by device 1000b in FIG. 10B can facilitate the ability to flow current through the pillars (e.g., electrically conductive pillars 140 of electrically conductive pillar array 142). In some embodiments, device 1000c can facilitate fluidic connection and electrical connection on opposite sides of device 1000c, thereby enabling access to both access points.

Figure 11:
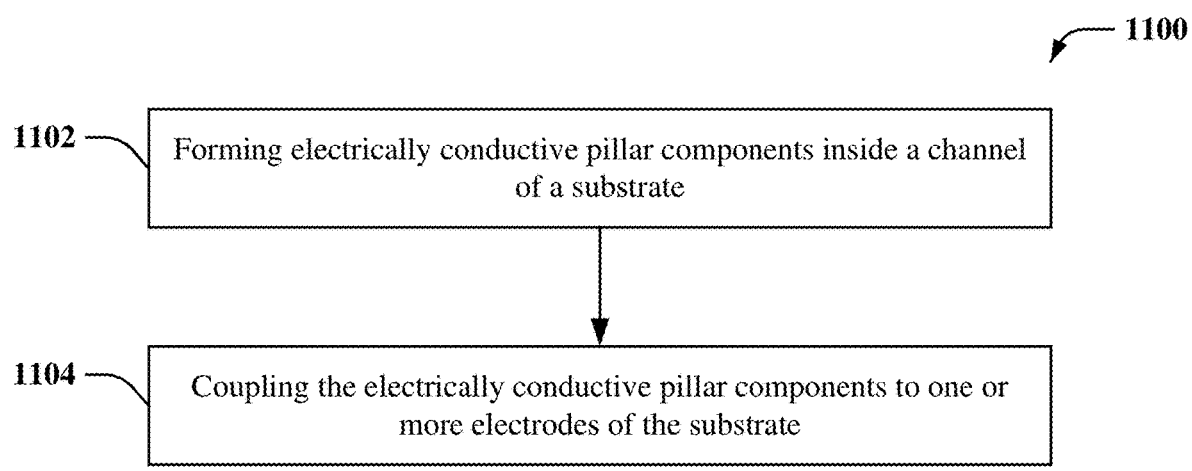
FIGS. 11, 12, and 13 illustrate flow diagrams of example, non-limiting methods that can facilitate electrically conductive deterministic lateral displacement (DLD) pillar array components in accordance with one or more embodiments described herein.
Figure 12:
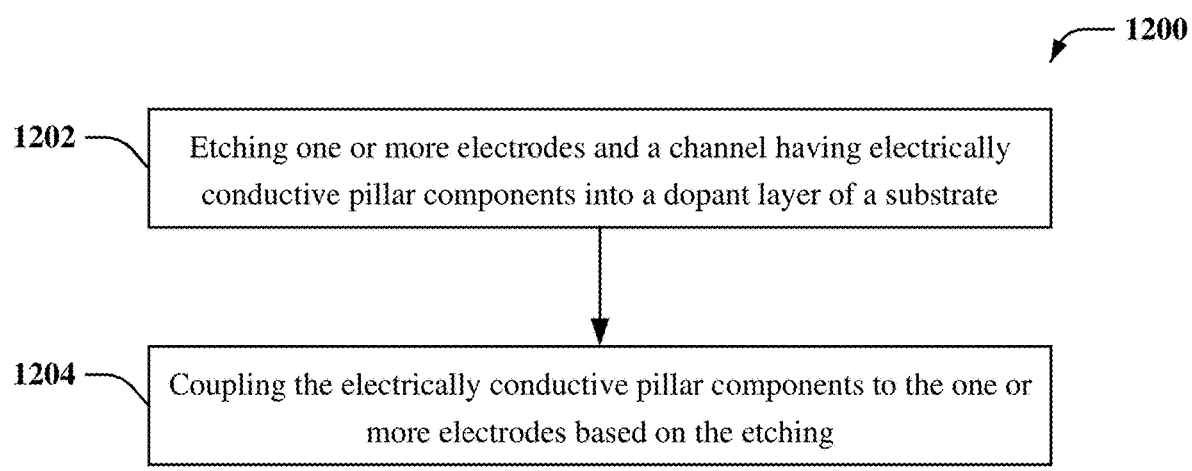
Figure 13:
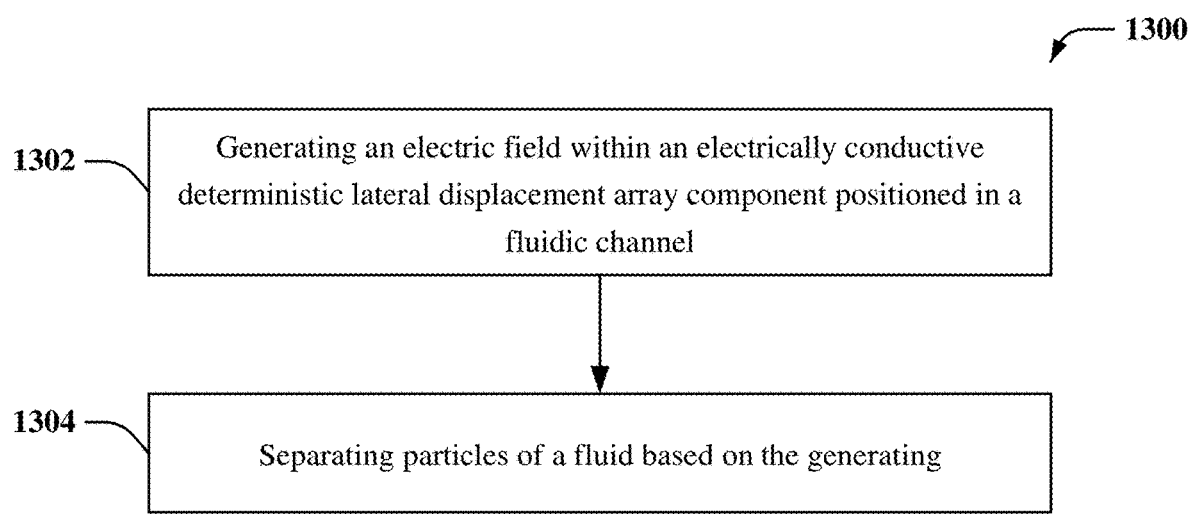

FIGS. 11, 12, and 13 illustrate flow diagrams of example, non-limiting methods 1100-1300 that can facilitate electrically conductive deterministic lateral displacement (DLD) pillar array components in accordance with one or more embodiments described herein. Repetitive description of like elements and/or processes employed in other embodiments described herein is omitted for sake of brevity.

In some embodiments, methods 1100-1300 can be implemented by a computing system (e.g., operating environment 1400 illustrated in FIG. 14 and described below) and/or a computing device (e.g., computer 1412 illustrated in FIG. 14 and described below). In non-limiting example embodiments, such computing system (e.g., operating environment 1400) and/or such computing device (e.g., computer 1412) can comprise one or more processors and one or more memory devices that can store executable instructions thereon that, when executed by the one or more processors, can facilitate performance of the operations described herein, including the non-limiting operations of methods 1100-1300 illustrated in FIGS. 11, 12, and 13, respectively. As a non-limiting example, the one or more processors can facilitate performance of the operations described herein, for example, methods 1100-1300, by directing and/or controlling one or more systems and/or equipment operable to perform semiconductor fabrication.

Referring now to FIG. 11, at 1102, forming (e.g., via computer 1412) electrically conductive pillar components (e.g., electrically conductive pillars 140 of electrically conductive pillar array 142) inside a channel (e.g., fluidic channel 130) of a substrate (e.g., substrate 102). At 1104, coupling (e.g., via computer 1412) the electrically conductive pillar components to one or more electrodes (e.g., metal contact pads 110, metal wires 112, electrode 606, electrode 608, etc.) of the substrate. In some embodiments, such forming at 1102 and/or coupling at 1104 can be performed (e.g., via computer 1412) utilizing the example non-limiting multi-step fabrication sequence described above with reference to FIGS. 1A, 1B, 1C, 1D, 1E, 1F, 1G, 1H, 1I, and 1J that can be implemented to fabricate one or more embodiments of the subject disclosure described herein and/or illustrated in the figures (e.g., devices 100a-100j, devices 500a-500d, devices 600a-600d, device 700a, device 800a, etc.).

Referring now to FIG. 12, at 1202, etching (e.g., via computer 1412) one or more electrodes (e.g., electrically conductive doped contact pads 326 and/or electrically conductive doped wires 328 etc.) and a channel (e.g., fluidic channel 324) having electrically conductive pillar components (electrically conductive doped pillars 320 of electrically conductive doped pillar array 322) into a dopant layer (e.g., dopant layer 310) of a substrate (e.g., doped substrate 302). At 1204, coupling (e.g., via computer 1412) the electrically conductive pillar components to the one or more electrodes based on the etching (e.g., as described above with reference to FIGS. 3D, 3E, and 3F). In some embodiments, such etching at 1202 and/or coupling at 1204 can be performed (e.g., via computer 1412) utilizing the example non-limiting multi-step fabrication sequence described above with reference to FIGS. 3A, 3B, 3C, 3D, 3E, 3F, and 3G that can be implemented to fabricate one or more embodiments of the subject disclosure described herein and/or illustrated in the figures (e.g., devices 300a-300g, devices 500a-500d, devices 600a-600d, device 700a, device 800a, etc.).

Referring now to FIG. 13, at 1302, generating (e.g., via computer 1412, voltage source 604, metal contact pads 110, metal wires 112, etc.) an electric field (e.g., a Debye layer, ionic layer, etc.) within an electrically conductive deterministic lateral displacement array component (e.g., electrically conductive pillar array 142) positioned in a fluidic channel (e.g., fluidic channel 130). At 1304, separating (e.g., via computer 1412, electrically conductive pillars 140, device 800a, device 900a, device 1000a, device 1000b, etc.) particles of a fluid (e.g., a colloid) based on the generating. In some embodiments, such generating at 1302 and/or separating at 1304 can be performed utilizing device 100j, device 300g, devices 500a-500e, devices 600a-600d, device 700a, device 800a, device 900a, device 1000a, and/or device 1000b, where such devices can be fabricated utilizing the example non-limiting multi-step fabrication sequences described above with reference to: FIGS. 1A, 1B, 1C, 1D, 1E, 1F, 1G, 1H, 1I, and 1J; FIGS. 3A, 3B, 3C, 3D, 3E, 3F, and 3G; FIGS. 5A, 5B, 5C, 5D, and 5E, and/or FIGS. 6A, 6B, 6C, and 6D.

For simplicity of explanation, the methodologies described herein (e.g., computer-implemented methodologies) are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the methodologies described herein (e.g., computer-implemented methodologies) in accordance with the disclosed subject matter. In addition, those skilled in the art will understand and appreciate that such methodologies could alternatively be represented as a series of interrelated states via a state diagram or events. Additionally, it should be further appreciated that the methodologies (e.g., computer-implemented methodologies) disclosed hereinafter and throughout this specification are capable of being stored on an article of manufacture to facilitate transporting and transferring such methodologies (e.g., computer-implemented methodologies) to computers. The term article of manufacture, as used herein, is intended to encompass a computer program accessible from any computer-readable device or storage media.

Figure 14:
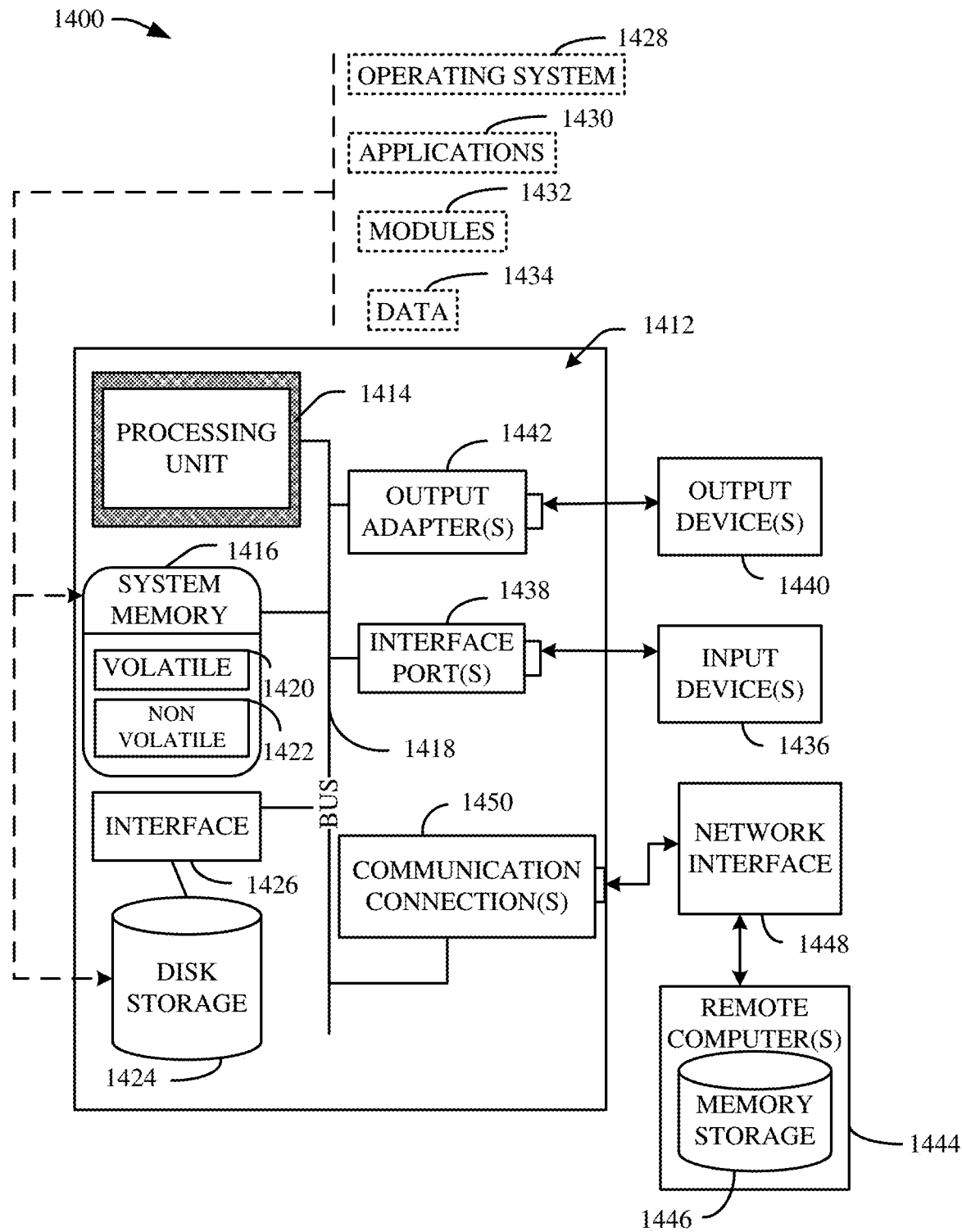
FIG. 14 illustrates a block diagram of an example, non-limiting operating environment in which one or more embodiments described herein can be facilitated.

In order to provide a context for the various aspects of the disclosed subject matter, FIG. 14 as well as the following discussion are intended to provide a general description of a suitable environment in which the various aspects of the disclosed subject matter can be implemented. FIG. 14 illustrates a block diagram of an example, non-limiting operating environment in which one or more embodiments described herein can be facilitated. For example, operating environment 1400 can be used to implement the example, non-limiting method 1100 of FIG. 11, non-limiting method 1200 of FIG. 12, and/or non-limiting method 1300 of FIG. 13, which facilitate implementing various embodiments of the subject disclosure described herein. Repetitive description of like elements and/or processes employed in other embodiments described herein is omitted for sake of brevity.

With reference to FIG. 14, a suitable operating environment 1400 for implementing various aspects of this disclosure can also include a computer 1412. The computer 1412 can also include a processing unit 1414, a system memory 1416, and a system bus 1418. The system bus 1418 couples system components including, but not limited to, the system memory 1416 to the processing unit 1414. The processing unit 1414 can be any of various available processors. Dual microprocessors and other multiprocessor architectures also can be employed as the processing unit 1414. The system bus 1418 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1416 can also include volatile memory 1420 and nonvolatile memory 1422. The basic input/output system (BIOS), containing the basic routines to transfer information between elements within the computer 1412, such as during start-up, is stored in nonvolatile memory 1422. Computer 1412 can also include removable/non-removable, volatile/non-volatile computer storage media. FIG. 14 illustrates, for example, a disk storage 1424. Disk storage 1424 can also include, but is not limited to, devices like a magnetic disk drive, floppy disk drive, tape drive, Jaz drive, Zip drive, LS-100 drive, flash memory card, or memory stick. The disk storage 1424 also can include storage media separately or in combination with other storage media. To facilitate connection of the disk storage 1424 to the system bus 1418, a removable or non-removable interface is typically used, such as interface 1426. FIG. 14 also depicts software that acts as an intermediary between users and the basic computer resources described in the suitable operating environment 1400. Such software can also include, for example, an operating system 1428. Operating system 1428, which can be stored on disk storage 1424, acts to control and allocate resources of the computer 1412.

System applications 1430 take advantage of the management of resources by operating system 1428 through program modules 1432 and program data 1434, e.g., stored either in system memory 1416 or on disk storage 1424. It is to be appreciated that this disclosure can be implemented with various operating systems or combinations of operating systems. A user enters commands or information into the computer 1412 through input device(s) 1436. Input devices 1436 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1414 through the system bus 1418 via interface port(s) 1438. Interface port(s) 1438 include, for example, a serial port, a parallel port, a game port, and a universal serial bus (USB). Output device(s) 1440 use some of the same type of ports as input device(s) 1436. Thus, for example, a USB port can be used to provide input to computer 1412, and to output information from computer 1412 to an output device 1440. Output adapter 1442 is provided to illustrate that there are some output devices 1440 like monitors, speakers, and printers, among other output devices 1440, which require special adapters. The output adapters 1442 include, by way of illustration and not limitation, video and sound cards that provide a means of connection between the output device 1440 and the system bus 1418. It should be noted that other devices and/or systems of devices provide both input and output capabilities such as remote computer(s) 1444.

Computer 1412 can operate in a networked environment using logical connections to one or more remote computers, such as remote computer(s) 1444. The remote computer(s) 1444 can be a computer, a server, a router, a network PC, a workstation, a microprocessor based appliance, a peer device or other common network node and the like, and typically can also include many or all of the elements described relative to computer 1412. For purposes of brevity, only a memory storage device 1446 is illustrated with remote computer(s) 1444. Remote computer(s) 1444 is logically connected to computer 1412 through a network interface 1448 and then physically connected via communication connection 1450. Network interface 1448 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1450 refers to the hardware/software employed to connect the network interface 1448 to the system bus 1418. While communication connection 1450 is shown for illustrative clarity inside computer 1412, it can also be external to computer 1412. The hardware/software for connection to the network interface 1448 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
   a substrate having a channel comprising electrically conductive pillar components coupled to one or more electrodes; and
   a seal layer coupled to the substrate that seals the one or more electrodes, wherein at least one of the seal layer or the electrically conductive pillar components is coupled to an encapsulation component that seals the channel.

2. The device of claim 1, wherein the electrically conductive pillar components are arranged as an asymmetric array in the channel, thereby facilitating improved separation of particles in a fluid.

3. The device of claim 1, wherein the electrically conductive pillar components respectively comprise:
   a pillar core comprising the substrate;
   an electrically conductive layer coupled to the pillar core; and
   a bonding layer coupled to the electrically conductive layer.

4. The device of claim 1, wherein the channel is coupled to one or more input ports and one or more output ports of the substrate.

5. The device of claim 1, wherein the encapsulation component comprises at least one of an electrically conductive layer or a dielectric layer.

6. The device of claim 1, wherein the encapsulation component comprises one or more cut-outs.

7. A method, comprising:
   forming electrically conductive pillar components inside a channel of a substrate; and
   coupling the electrically conductive pillar components to one or more electrodes of the substrate, wherein a seal layer is coupled to the substrate and seals the one or more electrodes, and wherein at least one of the seal layer or the electrically conductive pillar components is coupled to an encapsulation component that seals the channel.

8. The method of claim 7, wherein the forming comprises forming an asymmetric array of the electrically conducting pillar components inside the channel.

9. The method of claim 7, wherein the forming comprises:
   etching pillars into the substrate;
   depositing an electrically conductive layer onto the pillars; and
   depositing a bonding layer onto the electrically conductive layer.

10. The method of claim 7, wherein the coupling comprises overlapping an electrically conductive layer of the electrically conductive pillar components onto the one or more electrodes.

11. The method of claim 7, further comprising depositing a seal layer onto at least one of the substrate or the one or more electrodes.

12. The method of claim 7, further comprising etching one or more input ports and one or more output ports into the substrate.

13. The method of claim 7, further comprising coupling an encapsulation component having one or more cut-outs to the electrically conductive pillar components.

* * * * *